(12) United States Patent
Kobayashi et al.

(10) Patent No.: US 10,184,167 B2
(45) Date of Patent: Jan. 22, 2019

(54) RESTRICTING PLATE UNIT, VAPOR DEPOSITION UNIT, AND VAPOR DEPOSITION DEVICE

(71) Applicant: Sharp Kabushiki Kaisha, Osaka-shi (JP)

(72) Inventors: Yuhki Kobayashi, Osaka (JP); Katsuhiro Kikuchi, Osaka (JP); Shinichi Kawato, Osaka (JP); Satoshi Inoue, Osaka (JP); Takashi Ochi, Osaka (JP); Eiichi Matsumoto, Mitsuke (JP); Masahiro Ichihara, Mitsuke (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 518 days.

(21) Appl. No.: 14/897,182

(22) PCT Filed: Mar. 30, 2014

(86) PCT No.: PCT/JP2014/056141
§ 371 (c)(1),
(2) Date: Dec. 9, 2015

(87) PCT Pub. No.: WO2014/199686
PCT Pub. Date: Dec. 18, 2014

(65) Prior Publication Data
US 2016/0122861 A1    May 5, 2016

(30) Foreign Application Priority Data
Jun. 11, 2013   (JP) ................................. 2013-122785

(51) Int. Cl.
*C23C 14/04*   (2006.01)
*C23C 14/24*   (2006.01)
(Continued)

(52) U.S. Cl.
CPC .......... *C23C 14/042* (2013.01); *C23C 14/044* (2013.01); *C23C 14/12* (2013.01);
(Continued)

(58) Field of Classification Search
None
See application file for complete search history.

(56) References Cited

U.S. PATENT DOCUMENTS

2004/0115338 A1* 6/2004 Yoneda ................. C23C 14/042
427/66
2010/0297349 A1   11/2010 Lee et al.

FOREIGN PATENT DOCUMENTS

EP           1418250 A2 * 12/2004
JP        2010-270396      12/2010

OTHER PUBLICATIONS

International Search Report dated Jun. 17, 2014, directed to International Application No. PCT/JP2014/056141; 4 pages.

* cited by examiner

*Primary Examiner* — Joseph A Miller, Jr.
(74) *Attorney, Agent, or Firm* — ScienBiziP, P.C.

(57) ABSTRACT

A vapor deposition unit (1) includes a vapor deposition mask (50), a vapor deposition source (10), and a limiting plate unit (20). The limiting plate unit (20) includes (i) a plurality of first limiting plates (32) separated from each other in an X axis direction and (ii) a plurality of second limiting plates (42) disposed directly above the first limiting plates (32) in a plan view and separated from each other in the X axis direction. At least two second limiting plates (42) are arranged in the X axis direction for each first limiting plate (32).

11 Claims, 21 Drawing Sheets

(51) Int. Cl.
*H01L 51/00* (2006.01)
*H01L 51/56* (2006.01)
*C23C 14/12* (2006.01)
*C23C 16/04* (2006.01)

(52) U.S. Cl.
CPC ............ *C23C 14/24* (2013.01); *C23C 16/042* (2013.01); *H01L 51/0011* (2013.01); *H01L 51/56* (2013.01)

RESTRICTING PLATE UNIT, VAPOR DEPOSITION UNIT, AND VAPOR DEPOSITION DEVICE

This application is a national phase application under 35 U.S.C. 371 of International Application No. PCT/JP2014/056141, filed Mar. 10, 2014, and which claims priority to Japanese Patent Application No. 2013-122785, filed on Jun. 11, 2013, the contents of which are incorporated herein by reference in their entirety.

FIELD OF THE INVENTION

The present invention relates to a limiting plate unit, a vapor deposition unit, and a vapor deposition device each for forming, on a film formation target substrate, a vapor-deposited film having a predetermined pattern.

BACKGROUND OF THE INVENTION

Recent years have witnessed practical use of a flat-panel display in various products and fields. This has led to a demand for a flat-panel display that is larger in size, that achieves higher image quality, and that consumes less power.

Under such circumstances, great attention has been drawn to an organic electroluminescent (hereinafter abbreviated to "EL") display device that (i) includes an organic EL element which uses electroluminescence of an organic material and that (ii) is an all-solid-state flat-panel display which is excellent in, for example, low-voltage driving, high-speed response, and self-emitting.

An active matrix organic EL display device includes, for example, (i) a substrate made up of members such as a glass substrate and TFTs (thin film transistors) provided on the glass substrate and (ii) thin film organic EL elements provided on the substrate and electrically connected to the TFTs.

A full-color organic EL display device typically includes organic EL elements of red (R), green (G), and blue (B) as sub-pixels aligned on a substrate. A full-color organic EL display device carries out an image display by, with use of TFTs, selectively causing the organic EL elements to each emit light with a desired luminance.

Thus, such an organic EL display device needs to be produced through at least a process that forms, for each organic EL element, a luminescent layer having a predetermined pattern and made of an organic luminescent material which emits light of one of the above three colors.

Examples of known methods for forming such a luminescent layer having a predetermined pattern include a vacuum vapor deposition method, an inkjet method, and a laser transfer method. For example, the vacuum vapor deposition method is mainly used for a low-molecular organic EL display device (OLED) to pattern a luminescent layer.

The vacuum vapor deposition method uses a vapor deposition mask (also referred to as a shadow mask) having openings each having a predetermined pattern. A thin film having a predetermined pattern is formed by vapor-depositing vapor deposition particles (vapor deposition material, film formation material) from a vapor deposition source onto a vapor deposition target surface through the openings of the vapor deposition mask. In this case, the vapor deposition is carried out for each color of the luminescent layers (This is referred to as "selective vapor deposition").

The vacuum vapor-deposition method is roughly classified into two methods: (i) a method for forming a film while fixing or sequentially moving a film formation target substrate and a vapor-deposition mask so that the film formation target substrate and the vapor-deposition mask are brought into close contact with each other; and (ii) a scanning vapor-deposition method for forming a film while scanning a film formation target substrate and a vapor-deposition mask that are separated from each other.

The former method (i) uses a vapor deposition mask equivalent in size to a film formation target substrate. However, use of the vapor deposition mask equivalent in size to the film formation target substrate requires the vapor deposition mask to be larger in size as the film formation target substrate is larger in size. Such an increase in size of the film formation target substrate accordingly easily causes a gap between the film formation target substrate and the vapor deposition mask due to self-weight bending and extension of the vapor deposition mask. Therefore, with a large-sized substrate in use, it is difficult to carry out patterning with high accuracy, and there will occur positional displacement of vapor deposition and/or color mixture. This makes it difficult to form a high-definition vapor-deposition pattern.

Further, as the film formation target substrate is larger in size, not only the vapor deposition mask but also a frame, for example, that holds the vapor deposition mask and the like is enormously larger in size and weight. Thus, the increase in size of the film formation target substrate makes it difficult to handle, for example, the vapor deposition mask and the frame. This may cause a problem with productivity and/or safety. Further, a vapor deposition device itself and its accompanying devices are also larger in size and complicated. This makes device design difficult and increases installation cost.

In view of the problems, great attention has recently been drawn to a scan vapor deposition method for carrying out vapor deposition while carrying out scanning (scan vapor deposition) by use of a vapor deposition mask which is smaller than a film formation target substrate.

According to such a scan vapor deposition method, a band-shaped vapor deposition mask, for example, is used, and that vapor deposition mask is, for example, integrated with a vapor deposition source. Then, vapor deposition particles are vapor-deposited on an entire surface of a film formation target substrate while at least one of (i) the film formation target substrate and (ii) the combination of the vapor deposition mask and the vapor deposition source is moved relative to the other.

Thus, the scan vapor deposition method, which makes it unnecessary to use the vapor deposition mask equivalent in size to the film formation target substrate, can solve the above problems that uniquely occur when a large-sized vapor deposition mask is used.

The scanning vapor-deposition method typically involves a vapor deposition source having a plurality of emission holes (nozzles) so arranged at a predetermined pitch in a direction perpendicular to the scanning direction as to allow vapor deposition particles to be emitted (scattered) as a vapor deposition material is heated for evaporation or sublimation.

There have thus been proposed in recent years methods of limiting vapor deposition flows (that is, flows of vapor deposition particles) with use of limiting plates for scan vapor deposition so that vapor deposition particles emitted from a nozzle will not fly toward a vapor deposition region (film formation region) adjacent to a corresponding vapor deposition region, toward which adjacent vapor deposition region vapor deposition particles emitted from an adjacent nozzle fly.

Patent Literature 1 discloses, for example, that a blocking wall assembly is provided on one side of a vapor deposition source, the blocking wall assembly including, as limiting plates, a plurality of blocking walls partitioning a space between the vapor deposition source and a vapor deposition mask into a plurality of vapor deposition spaces. According to Patent Literature 1, since the blocking walls, serving as limiting plates, limit a vapor deposition range, it is possible to vapor-deposit a pattern with high definition while preventing spread of a vapor deposition pattern.

Japanese Patent Application Publication, Tokukai, No. 2010-270396 A (Publication Date: Dec. 2, 2010)

SUMMARY OF THE INVENTION

Unfortunately, in a case where the vapor deposition density is high (that is, the vapor deposition rate is high), conventional limiting plates fail to prevent vapor deposition particles emitted from a nozzle from flying toward an adjacent vapor deposition region, and thus fail to guide vapor deposition particles to the appropriate vapor deposition region.

(a) and (b) of FIG. 22 are diagrams schematically illustrating how vapor deposition flows vary depending on the difference in the vapor deposition density in a case where there are provided between a vapor deposition source 301 and a vapor deposition mask 302 a plurality of limiting plates 320 arranged along a direction perpendicular to the scanning direction (scanning axis).

(a) of FIG. 22 illustrates a case where the vapor deposition density is relatively low (low vapor deposition rate). (b) of FIG. 22 illustrates a case where the vapor deposition density is relatively high (high vapor deposition rate).

(a) and (b) of FIG. 22 each show (i) a Y axis as a horizontal axis extending in a scanning direction of the film formation target substrate 200, (ii) an X axis as a horizontal axis extending in a direction perpendicular to the scanning direction of the film formation target substrate 200, and (iii) a Z axis as a vertical axis (up-and-down axis) which is perpendicular to each of the X axis and the Y axis, which is normal to a vapor deposition target surface 201 (film formation target surface) of the film formation target substrate 200, and in which a vapor deposition axis orthogonal to the vapor deposition target surface 201 extends.

Vapor deposition particles 401 (vapor deposition flows) flying past upper opening edges 320a of the limiting plates 320 are blocked by non-opening regions of the vapor deposition mask 302 in the case where the vapor deposition rate is low (see the x mark in (a) of FIG. 22).

In the case where the vapor deposition rate is high, however, more vapor deposition particles 401 collide with each other and scattered near the upper opening edges 320a of the limiting plates 320 as illustrated in (b) of FIG. 22. This unfortunately lets vapor deposition flows limited by the limiting plates 320 spread immediately after passing through openings 321 between the limiting plates 320. Part of the spread vapor deposition flows reach an adjacent film formation region on the film formation target substrate 200 which adjacent film formation region corresponds to an adjacent nozzle 301a.

High rate vapor deposition thereby causes a film formation abnormality such as vapor deposition particles 401 from an adjacent nozzle (i) entering a normally patterned film or (ii) forming, between normally patterned films, an abnormally patterned film that would not be formed with a low vapor deposition rate. These phenomena cause a light emission abnormality such as a color mixed light emission, which may greatly decrease the display quality.

The present invention has been accomplished in view of the above problem. It is an object of the present invention to provide a limiting plate unit, a vapor deposition unit, and a vapor deposition device each capable of preventing film formation abnormalities.

In order to solve the above problem, a vapor deposition unit according to one mode of the present invention is a vapor deposition unit, including: a vapor deposition mask; a vapor deposition source for emitting vapor deposition particles toward the vapor deposition mask; and a limiting plate unit provided between the vapor deposition mask and the vapor deposition source so as to limit an angle at which the vapor deposition particles emitted by the vapor deposition source pass through the limiting plate unit, the limiting plate unit including a plurality of stages of limiting plates including at least: a plurality of first limiting plates provided away from each other in a first direction; and a plurality of second limiting plates provided (i) directly above the plurality of first limiting plates in a plan view, (ii) away from each other in the first direction, and (iii) along the plurality of first limiting plates, the plurality of second limiting plates being provided such that at least two second limiting plates are arranged in the first direction so as to correspond to each of the plurality of first limiting plates.

In order to solve the above problem, a vapor deposition unit according to one mode of the present invention is a vapor deposition unit, including: a vapor deposition mask; a vapor deposition source for emitting vapor deposition particles toward the vapor deposition mask; and a limiting plate unit provided between the vapor deposition mask and the vapor deposition source so as to limit an angle at which the vapor deposition particles emitted by the vapor deposition source pass through the limiting plate unit, the limiting plate unit including a plurality of first limiting plates provided away from each other in a first direction, the plurality of first limiting plates each having an upper surface on which at least two protrusions are arranged in the first direction along the plurality of first limiting plates.

In order to solve the above problem, a vapor deposition device according to one mode of the present invention is a vapor deposition device, including: a vapor deposition unit according to one mode of the present invention; and a moving device for, in a state where the vapor deposition mask of the vapor deposition unit faces a film formation target substrate, moving a first one of the vapor deposition unit and the film formation target substrate relative to a second one thereof in a second direction, perpendicular to the first direction, the vapor deposition mask having a width in the second direction which width is smaller than a width of the film formation target substrate in the second direction, the vapor deposition device, while scanning the film formation target substrate in the second direction, causing the vapor deposition particles emitted by the vapor deposition source to be vapor-deposited onto the film formation target substrate through an opening of the limiting plate unit and an opening of the vapor deposition mask.

In order to solve the above problem, a limiting plate unit according to one mode of the present invention is a limiting plate unit provided between a vapor deposition mask and a vapor deposition source so as to limit an angle at which vapor deposition particles emitted by the vapor deposition source pass through the limiting plate unit, the limiting plate unit including a plurality of stages of limiting plates including at least: a plurality of first limiting plates provided away from each other in a first direction; and a plurality of second limiting plates provided (i) directly above the plurality of first limiting plates in a plan view, (ii) away from each other in the first direction, and (iii) along the plurality of first limiting plates, the plurality of second limiting plates being provided such that at least two second limiting plates are arranged in the first direction so as to correspond to each of the plurality of first limiting plates.

In order to solve the above problem, a limiting plate unit according to one mode of the present invention is a limiting plate unit provided between a vapor deposition mask and a vapor deposition source so as to limit an angle at which vapor deposition particles emitted by the vapor deposition source pass through the limiting plate unit, the limiting plate unit including a plurality of first limiting plates provided away from each other in a first direction, the plurality of first limiting plates each having an upper surface on which at least two protrusions are arranged in the first direction along the plurality of first limiting plates.

An aspect of the present invention makes it possible to, with use of the first limiting plates, restrict spread of flows of vapor deposition particles emitted by the vapor deposition source (vapor deposition flows). The above configuration allows vapor deposition components having poor directivity to be blocked (captured) and limited for a distribution with high directivity. The controlled vapor deposition flows, in a case where the vapor deposition density is high (that is, at a high vapor deposition rate), tend to spread again after passing through the opening areas between the first limiting plates due to collision between and/or scattering of the vapor deposition particles which collision and scattering result from the high vapor deposition density. The vapor deposition flows are, however, captured by (i) subsequent stages of limiting plates including at least the second limiting plates or (ii) protrusions so that spread of the vapor deposition flows is restricted, and pass through the vapor deposition mask while spread of the vapor deposition flows is restricted. The at least two second limiting plates or the at least two protrusions arranged in the first direction so as to correspond to each first limiting plate can effectively capture vapor deposition flows spreading to the two first-direction sides of the first limiting plate. The above configuration can thus effectively restrict spread of vapor deposition flows in the first direction. The above configuration, as a result, makes it possible to (i) prevent film formation abnormalities such as an abnormally patterned film and (ii) form a fine pattern of a vapor-deposited film. Further, with the above configuration, the second limiting plates are disposed directly above the first limiting plates in a plan view, and are absent directly above the opening areas between the first limiting plates. The above configuration thus makes it possible to efficiently capture only a component with actually poor directivity without decreasing the vapor deposition rate at all.

Figure 4:
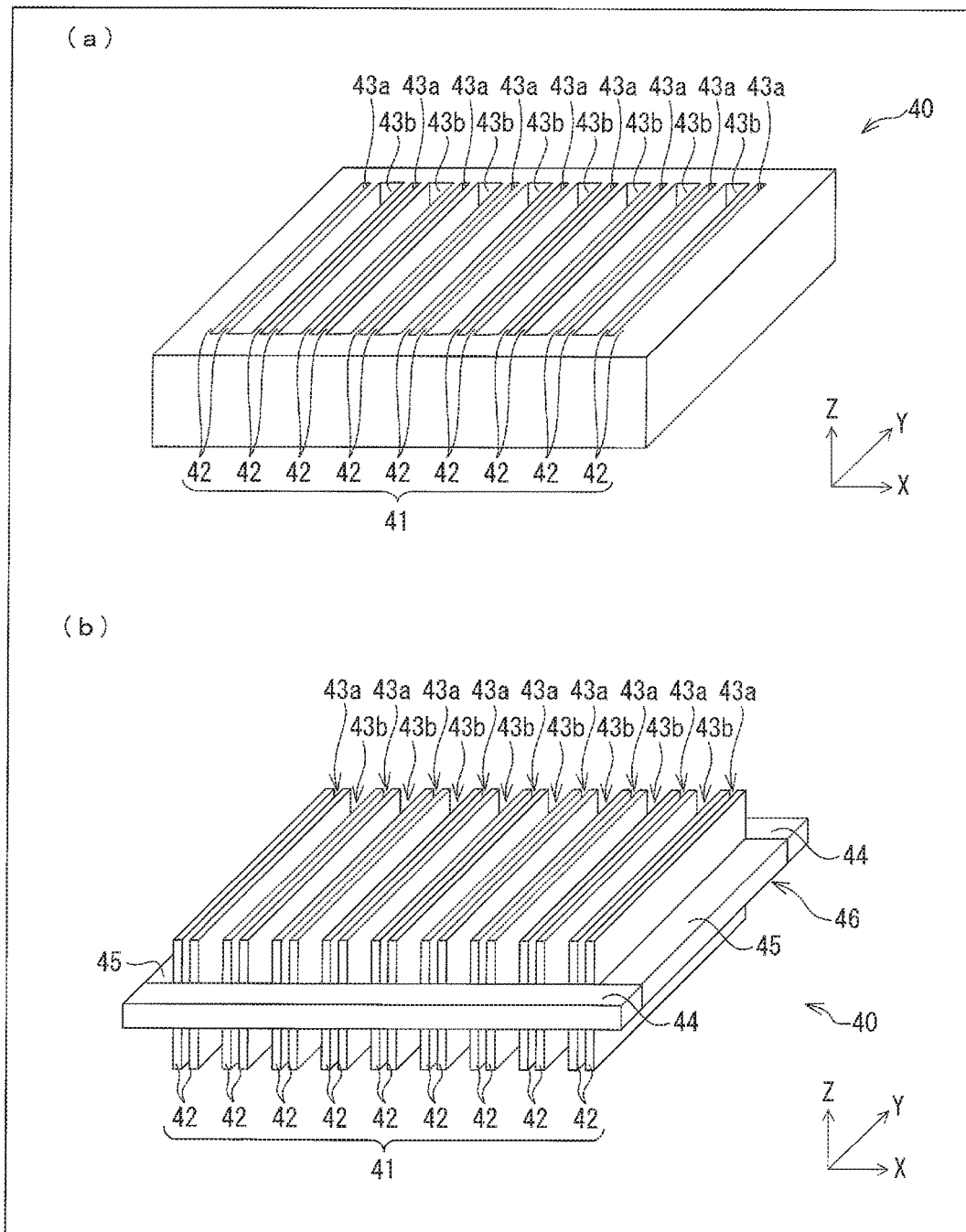

(a) and (b) FIG. 4 are each a perspective view schematically illustrating an example configuration of a second limiting plate assembly included in the limiting plate unit in accordance with Embodiment 1.

Figure 5:
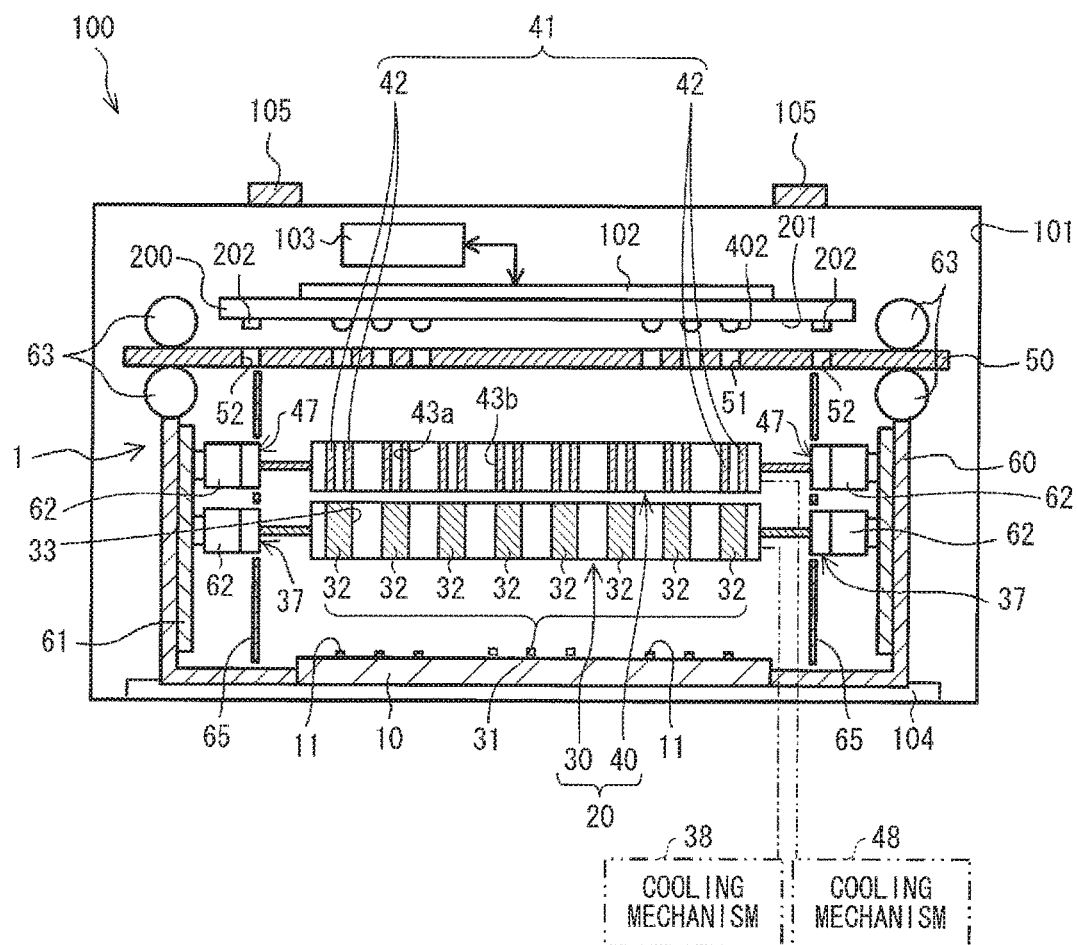

FIG. 5 is a cross-sectional view schematically illustrating a configuration of a substantial part of the vapor deposition device in accordance with Embodiment 1.

Figure 6:
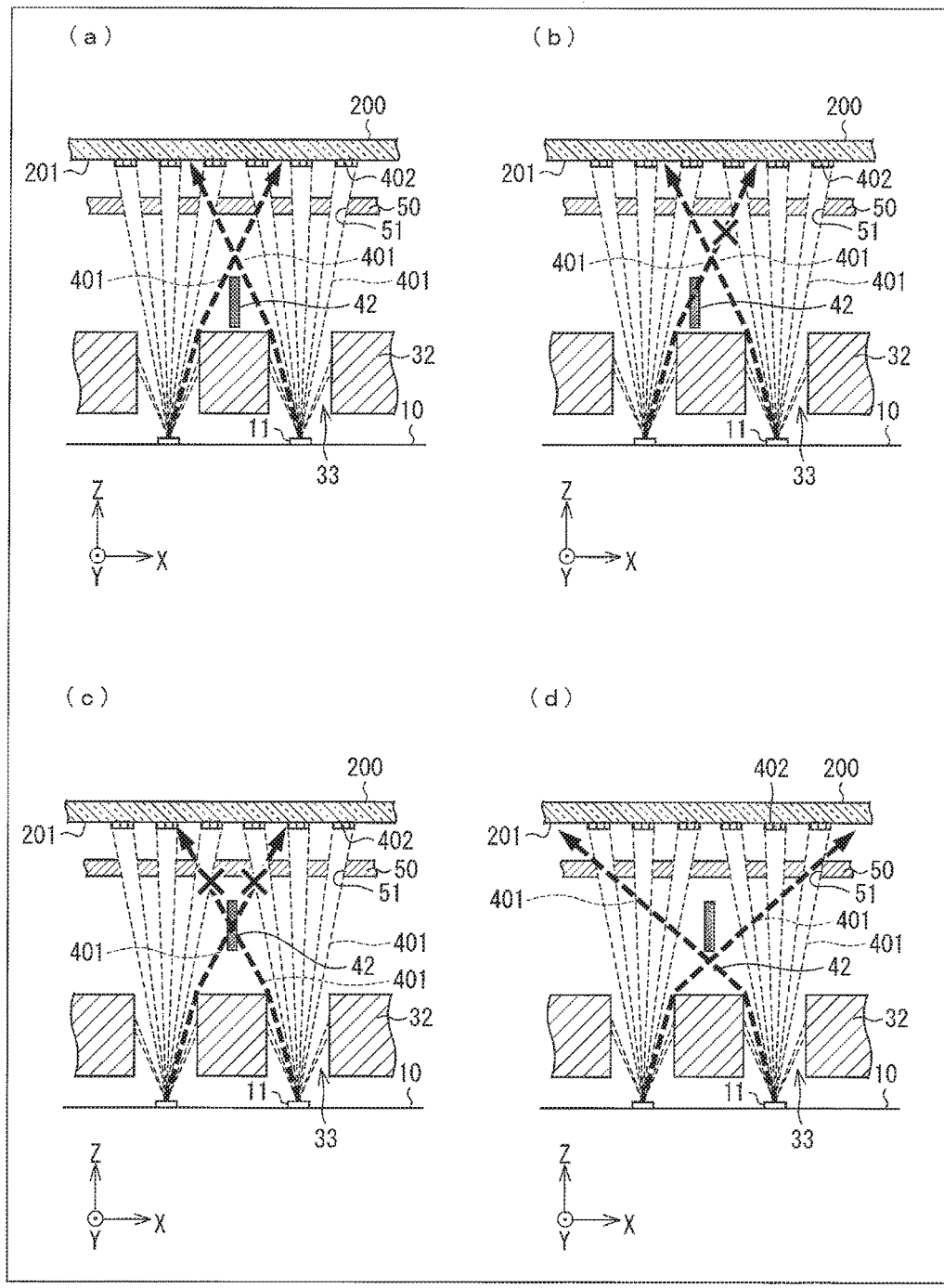

(a) through (d) FIG. 6 are each a cross-sectional view illustrating a comparative example in which for each first limiting plate, there is provided only one second limiting plate smaller than the first limiting plate.

Figure 7:
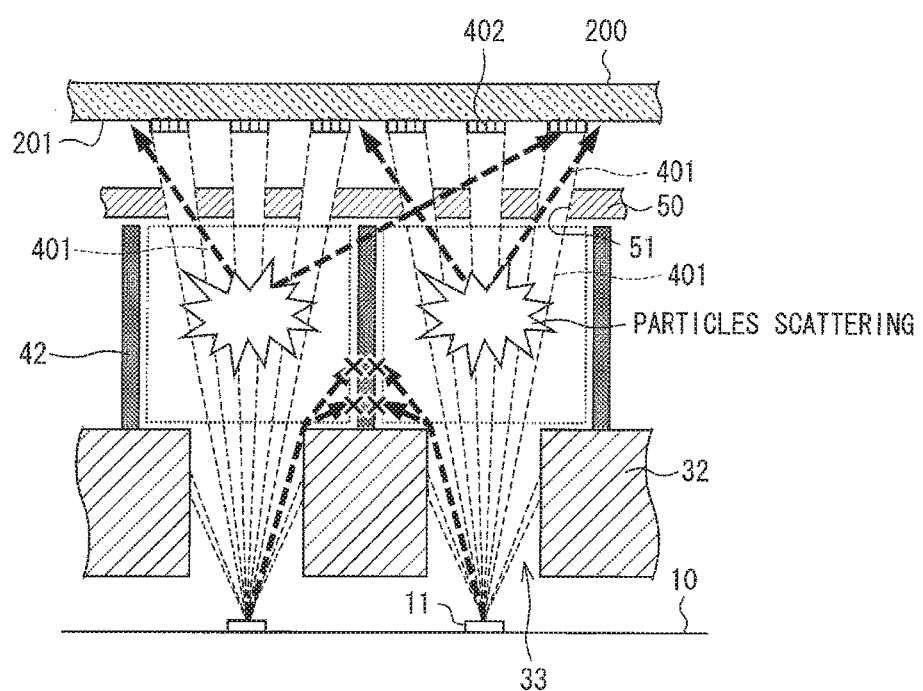

FIG. 7 is a cross-sectional view illustrating a comparative example in which for each first limiting plate, there is provided only one second limiting plate having a height extending from the top of the first limiting plate to the lower end of a vapor deposition mask.

Figure 8:
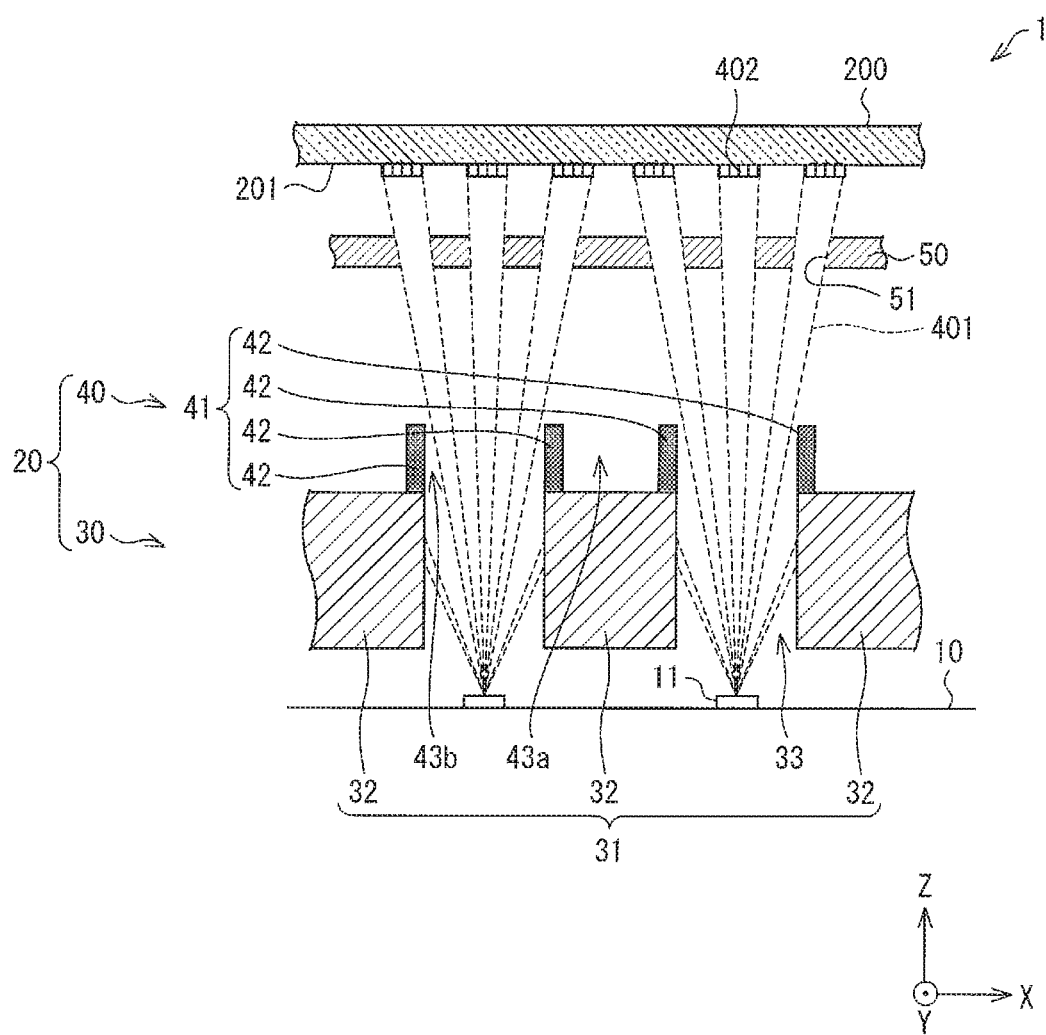

FIG. 8 is a cross-sectional view illustrating a substantial part of the vapor deposition unit in accordance with Embodiment 1, the view illustrating an example suitable arrangement of second limiting plates.

Figure 9:
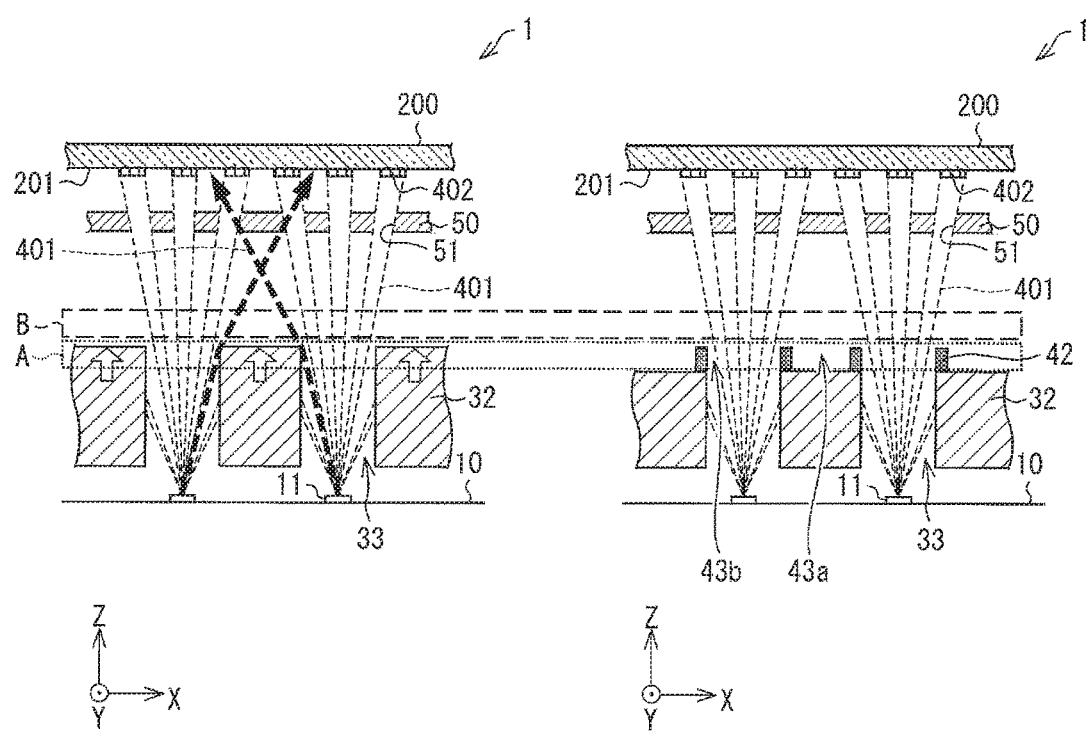

FIG. 9 is a cross-sectional view illustrating, next to each other, (i) a vapor deposition unit including second limiting plates illustrated in FIG. 8 and (ii) a vapor deposition unit including no second limiting plates and including first limiting plates extended in the Z axis direction to be equal in height to the second limiting plates.

Figure 10:
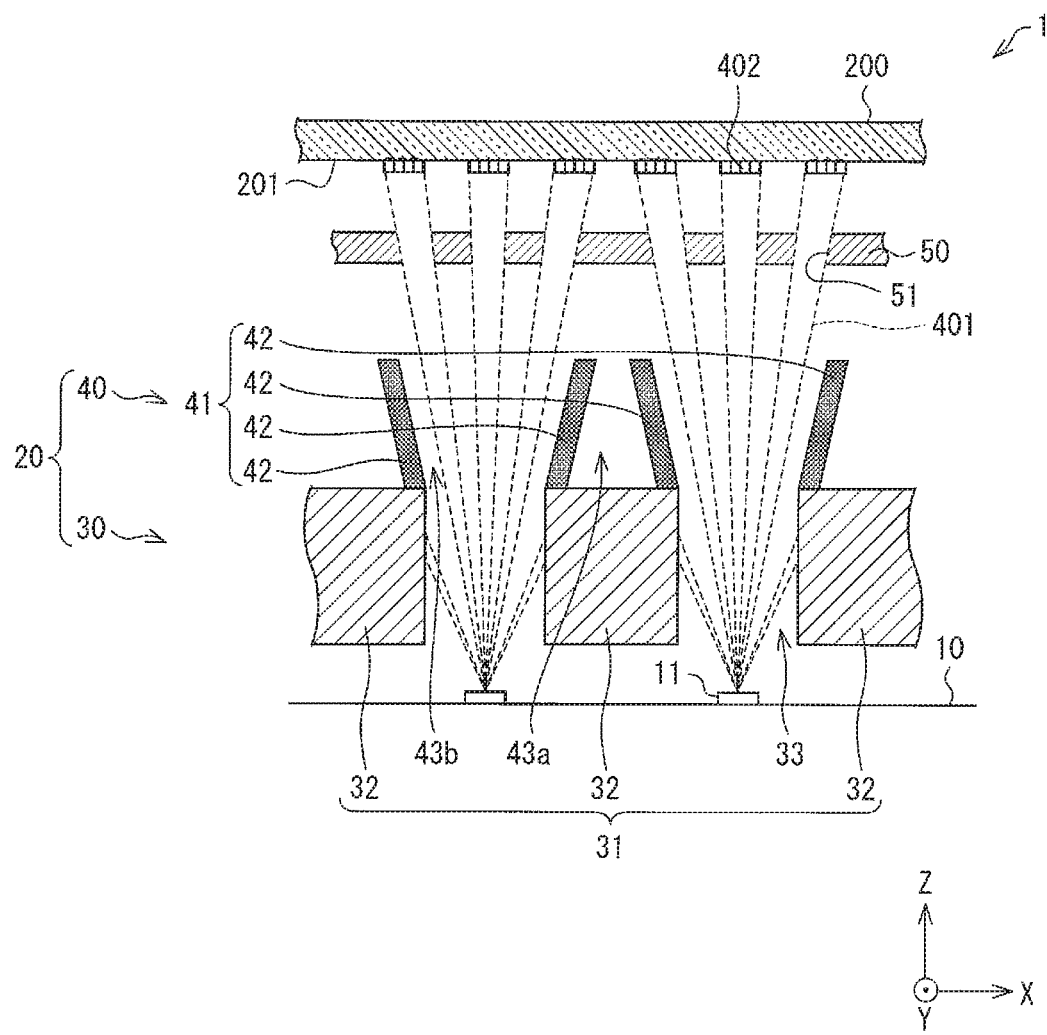

FIG. 10 is a cross-sectional view schematically illustrating a configuration of a substantial part of a vapor deposition unit including second limiting plates of Variation 1 of Embodiment 1 together with a film formation target substrate.

Figure 11:
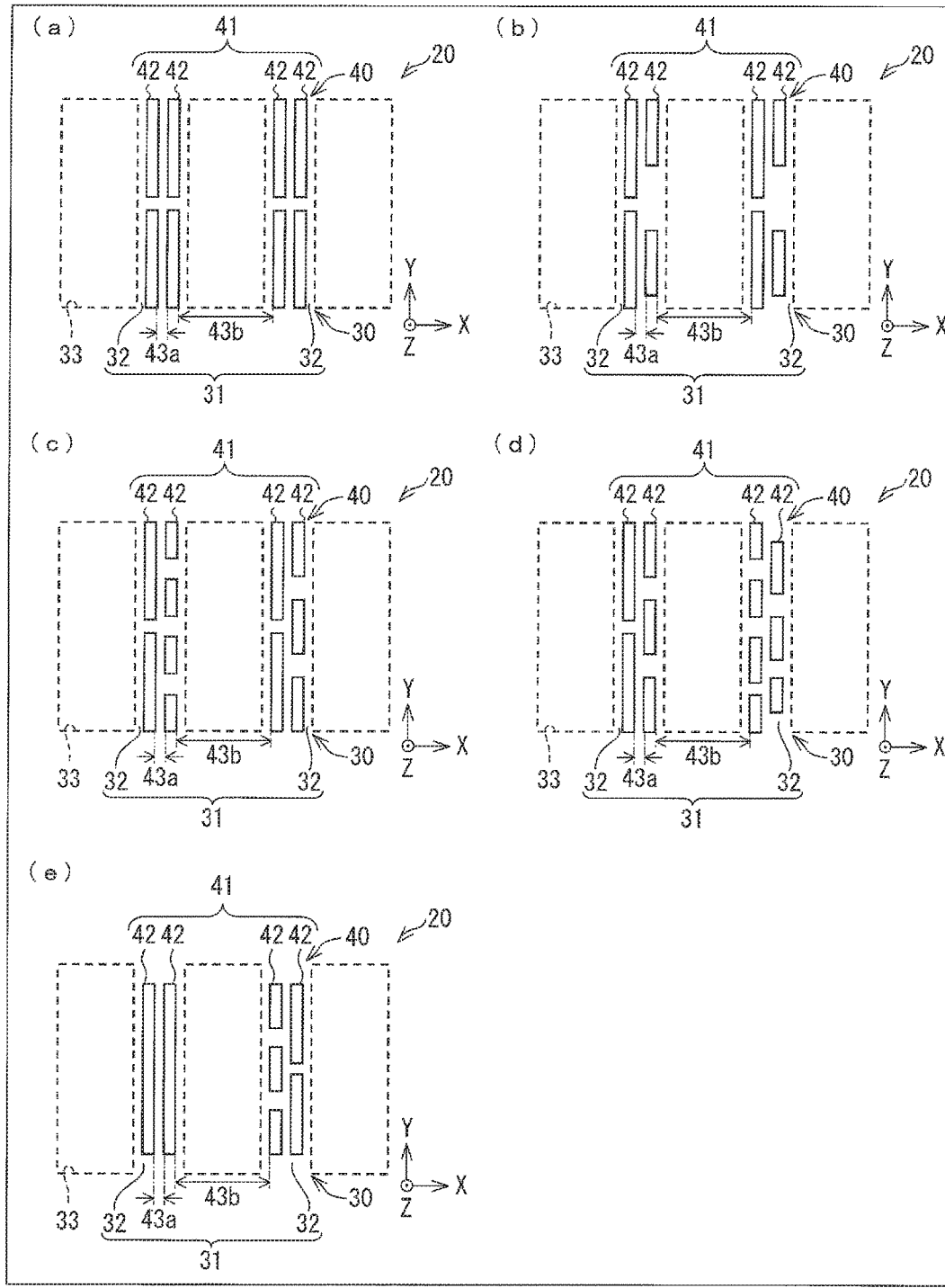

(a) through (e) of FIG. 11 are each a plan view illustrating an example pattern of second limiting plates in a substantial part of a limiting plate unit including second limiting plates of Variation 2 of Embodiment 1.

Figure 12:
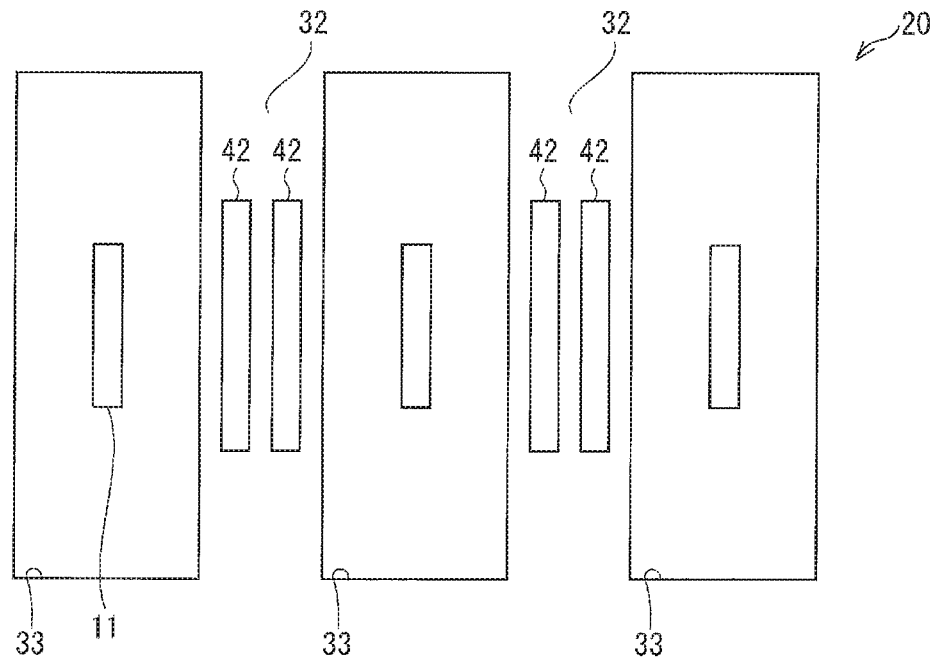

FIG. 12 is a plan view illustrating an example pattern of second limiting plates in a substantial part of a limiting plate unit including second limiting plates of Variation 3 of Embodiment 1 together with emission holes.

Figure 13:
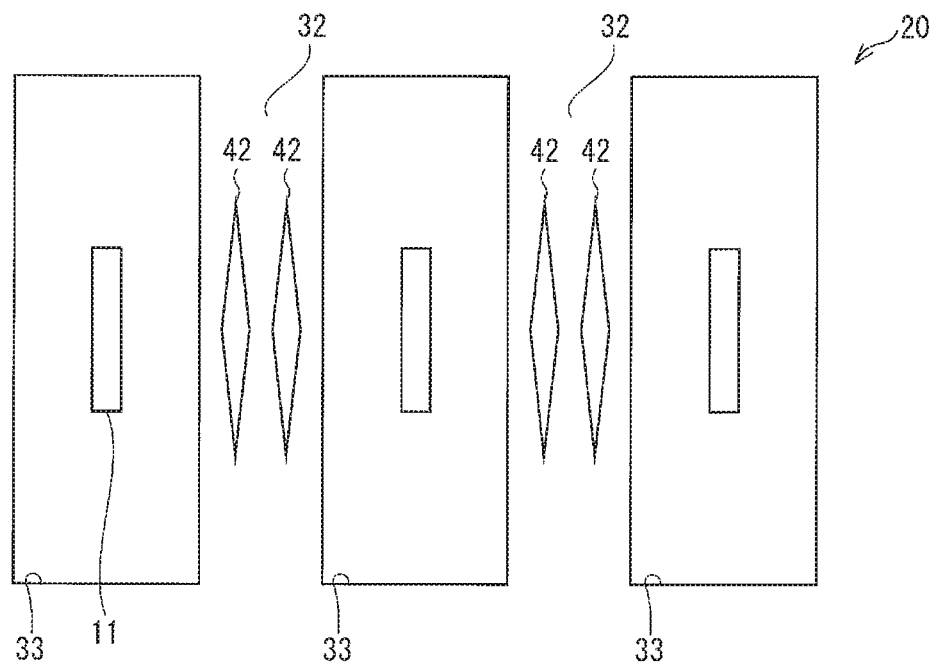

FIG. 13 is a plan view illustrating an example pattern of second limiting plates in a substantial part of a limiting plate unit including second limiting plates of Variation 4 of Embodiment 1 together with emission holes.

Figure 14:
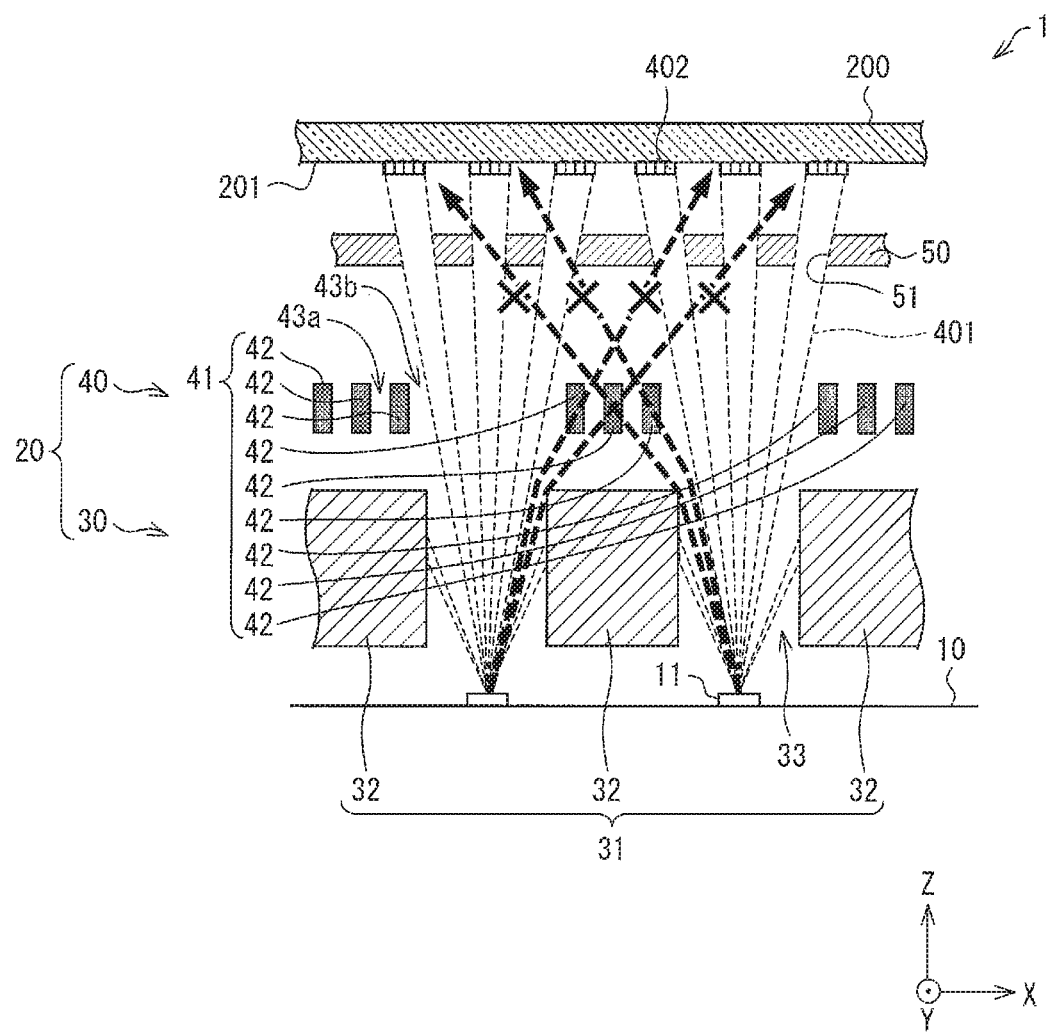

FIG. 14 is a cross-sectional view schematically illustrating a configuration of a substantial part of a vapor deposition unit in accordance with Embodiment 2 together with a film formation target substrate.

Figure 1:
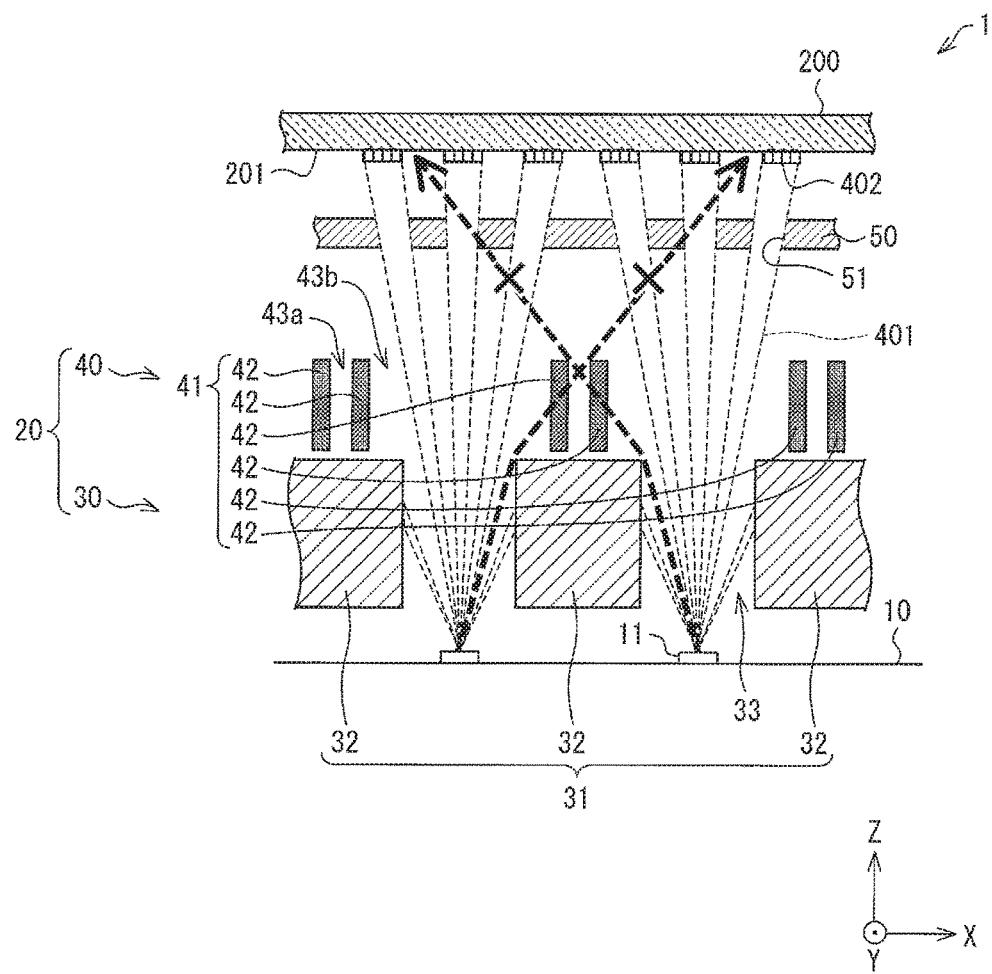
FIG. 1 is a cross-sectional view schematically illustrating a configuration of a substantial part of a vapor deposition unit in accordance with Embodiment 1 together with a film formation target substrate.
Figure 15:
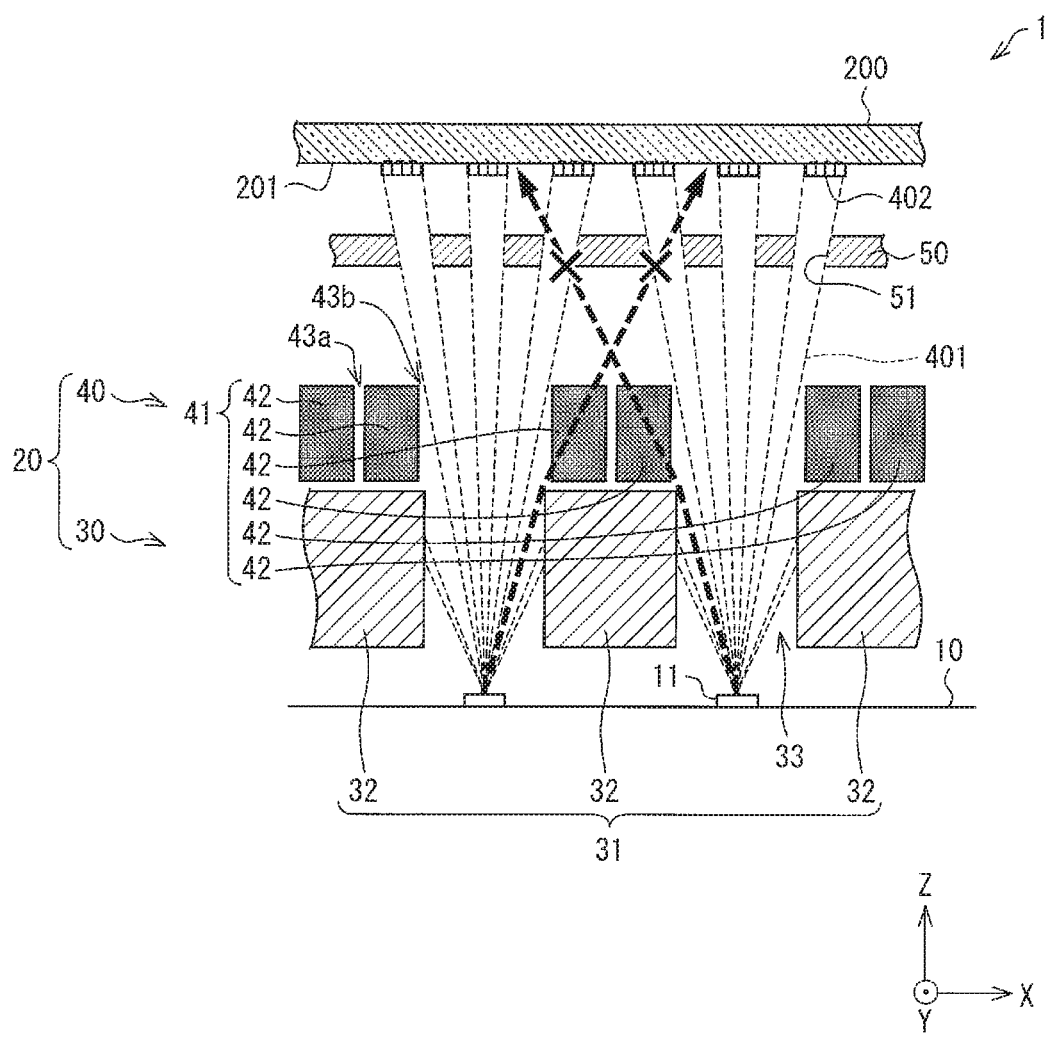

FIG. 15 is a cross-sectional view illustrating a substantial part of an example vapor deposition unit in which the second limiting plates illustrated in FIG. 1 each have a larger thickness in the X axis direction.

Figure 16:
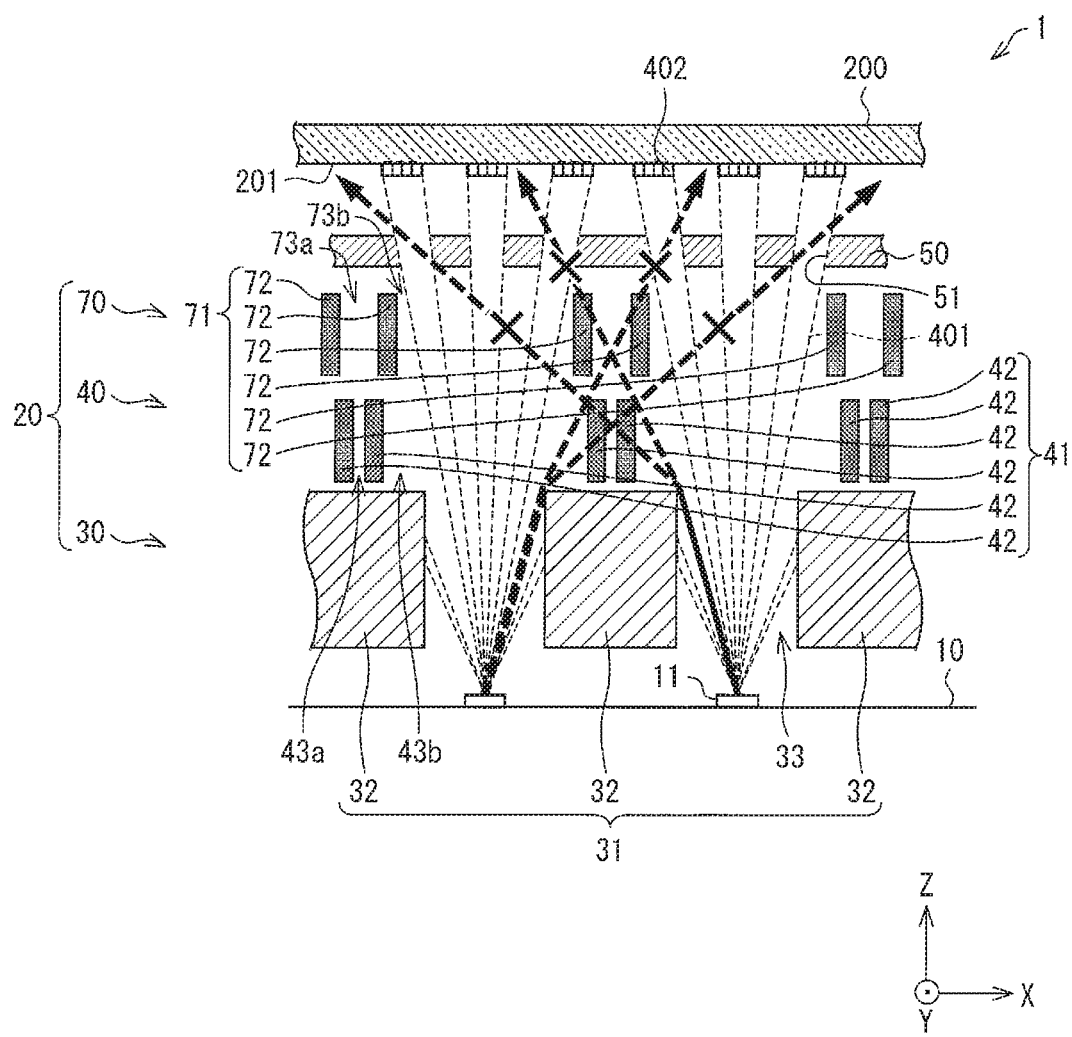

FIG. 16 is a cross-sectional view schematically illustrating a configuration of a vapor deposition unit including a second limiting plate assembly and a third limiting plate assembly between a first limiting plate assembly and a vapor deposition mask.

Figure 17:
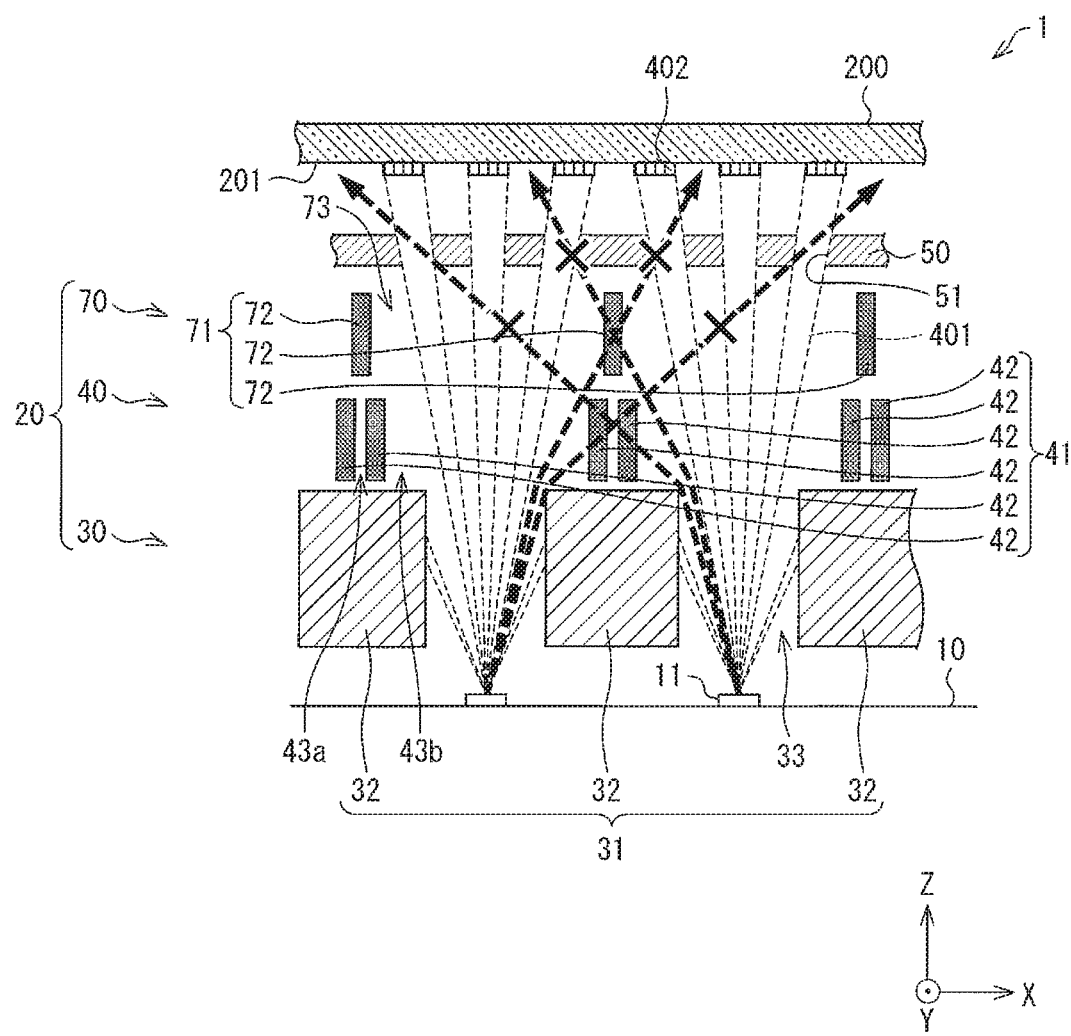

FIG. 17 is a cross-sectional view schematically illustrating an example configuration of a vapor deposition unit in accordance with Variation 2 of Embodiment 3.

Figure 18:
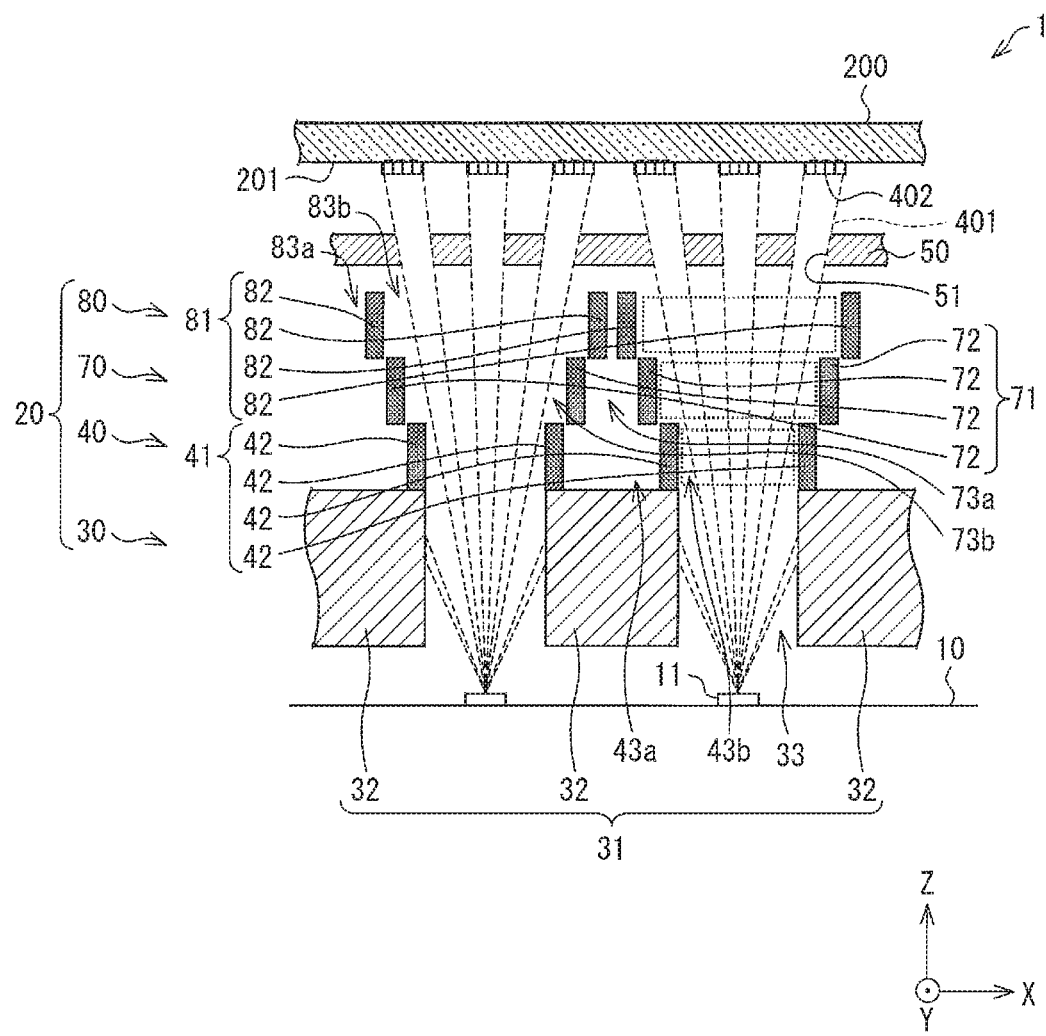

FIG. 18 is a cross-sectional view schematically illustrating an example configuration of a vapor deposition unit in accordance with Variation 3 of Embodiment 3.

Figure 19:
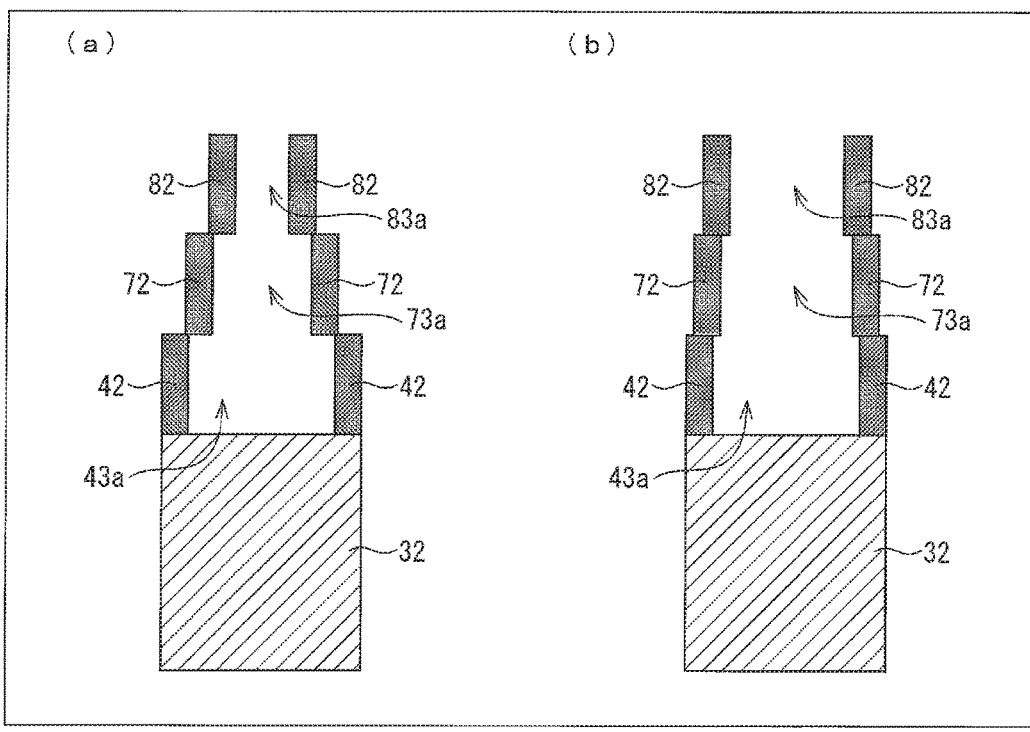

(a) and (b) of FIG. 19 are each a cross-sectional view illustrating an example manner of arranging limiting plates of each stage in accordance with Variation 3 of Embodiment 3.

Figure 20:
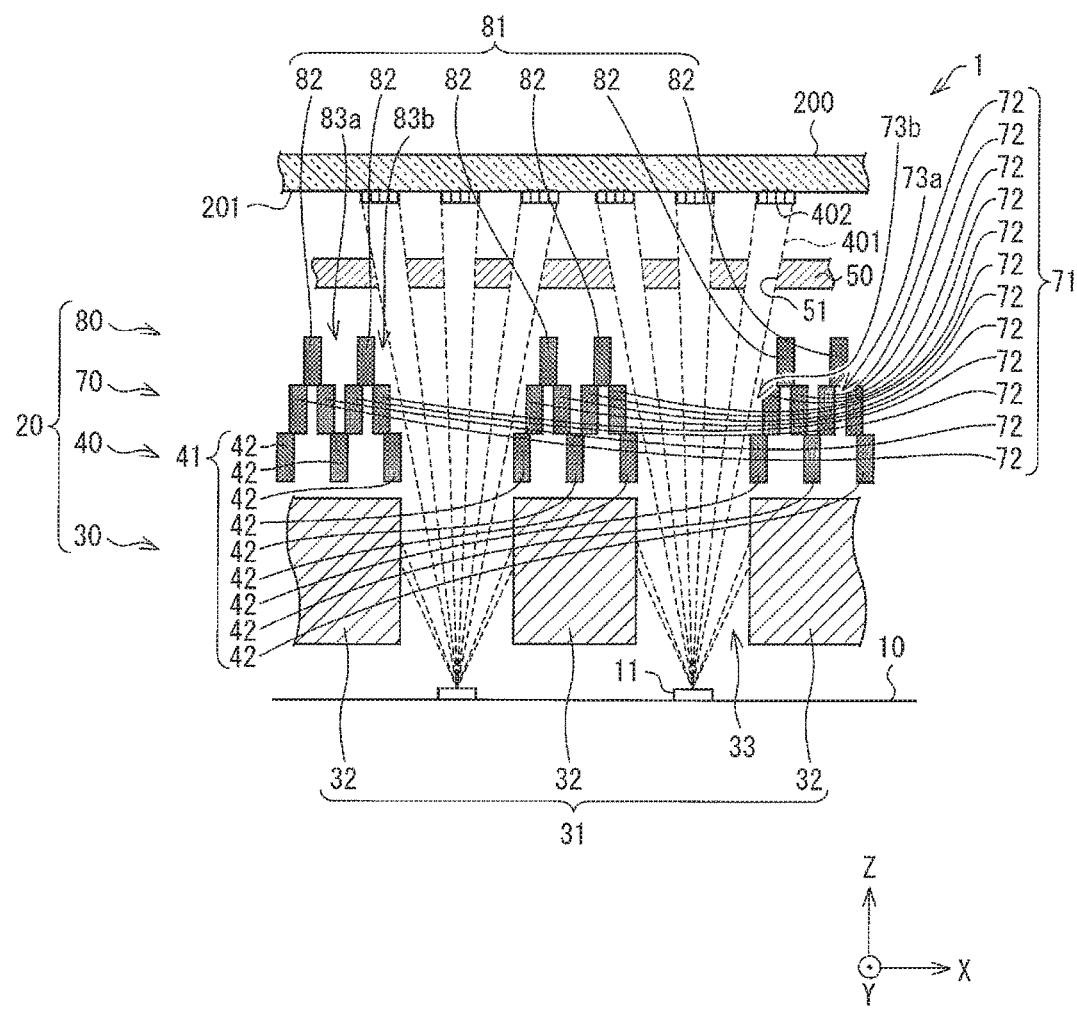

FIG. 20 is a cross-sectional view schematically illustrating an example configuration of a vapor deposition unit 1 in accordance with Variation 4 of Embodiment 3.

Figure 21:
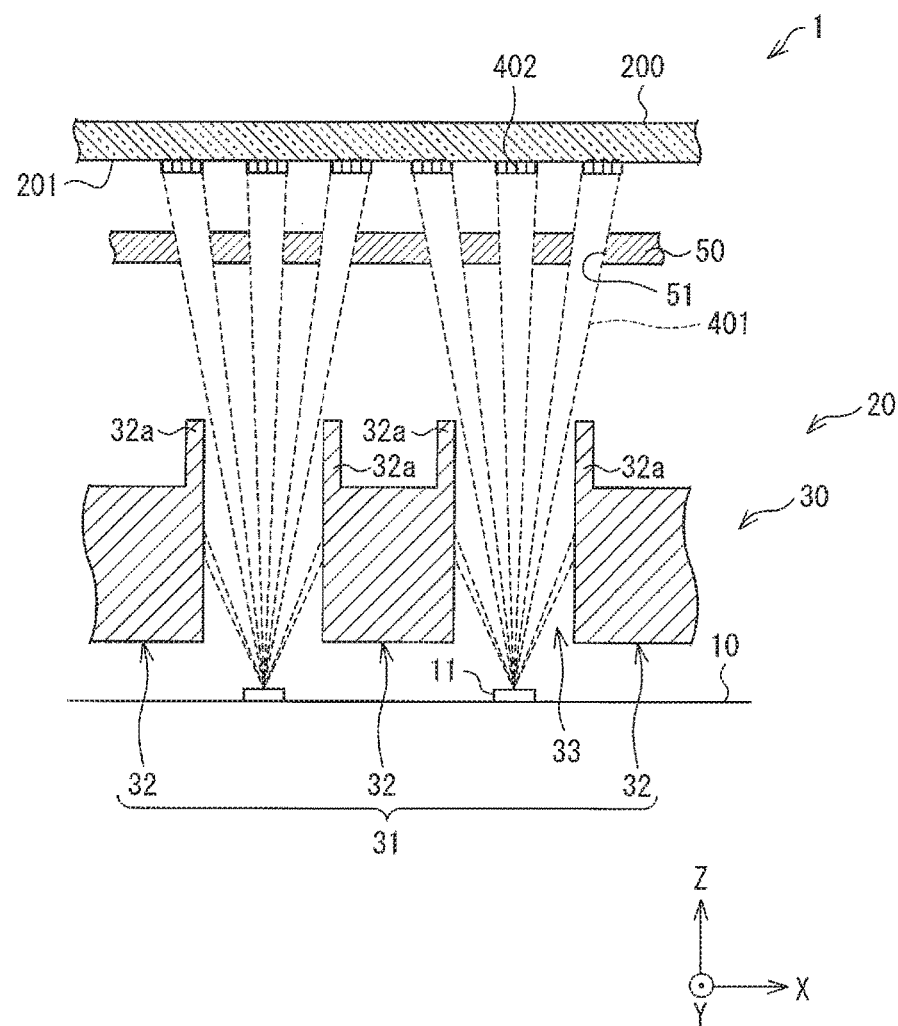

FIG. 21 is a cross-sectional view schematically illustrating a configuration of a substantial part of a vapor deposition unit 1 in accordance with Embodiment 4 together with a film formation target substrate 200.

Figure 22:
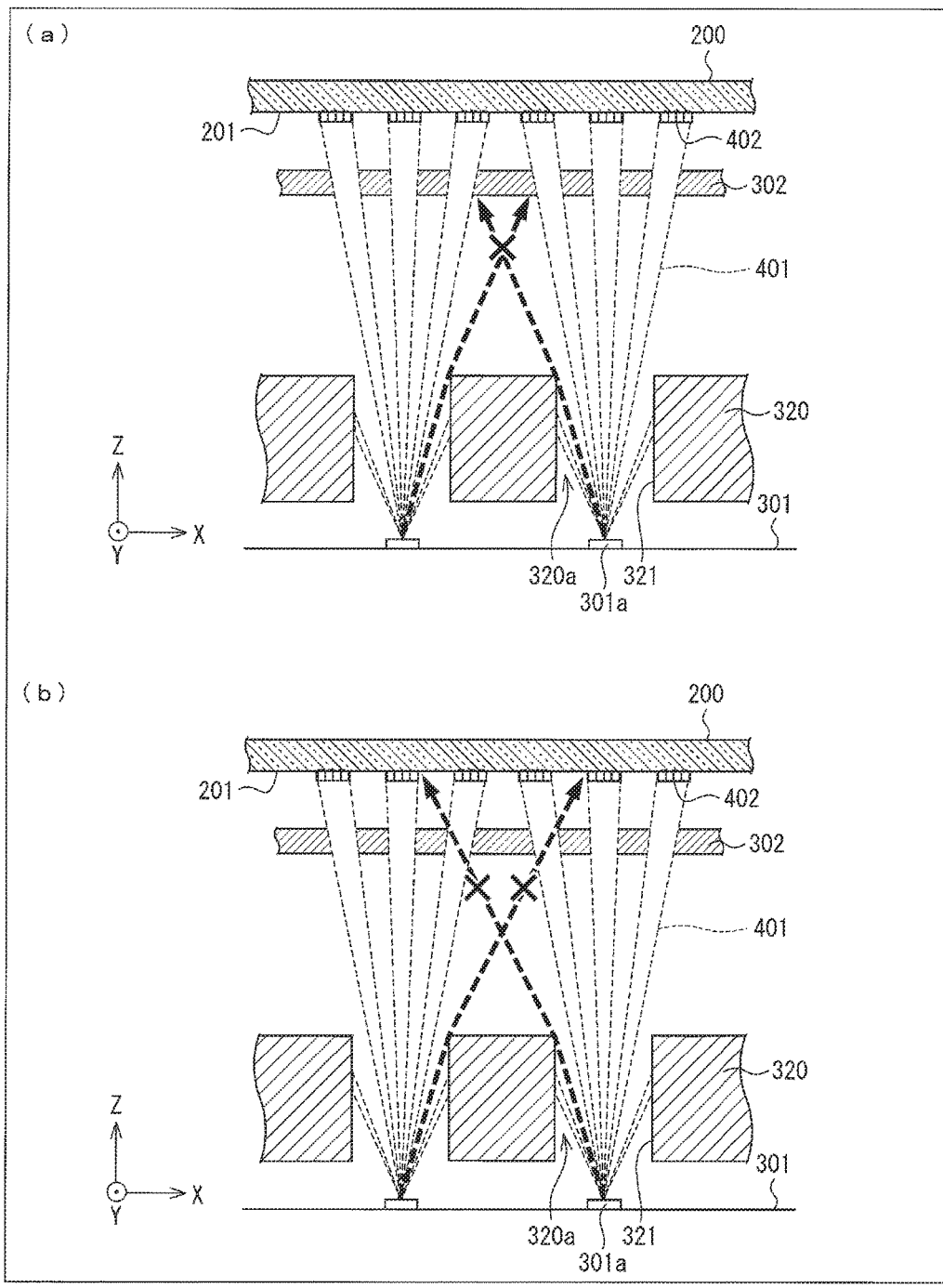

(a) and (b) of FIG. 22 are diagrams schematically illustrating how vapor deposition flows vary depending on the difference in the vapor deposition density in a case where there are provided between a vapor deposition source and a vapor deposition mask a plurality of limiting plates arranged along a direction perpendicular to the scanning direction.

DETAILED DESCRIPTION OF THE INVENTION

The description below deals in detail with example embodiments of the present invention.

The description below deals with one embodiment of the present invention with reference to FIGS. 1 through 13.

Figure 2:
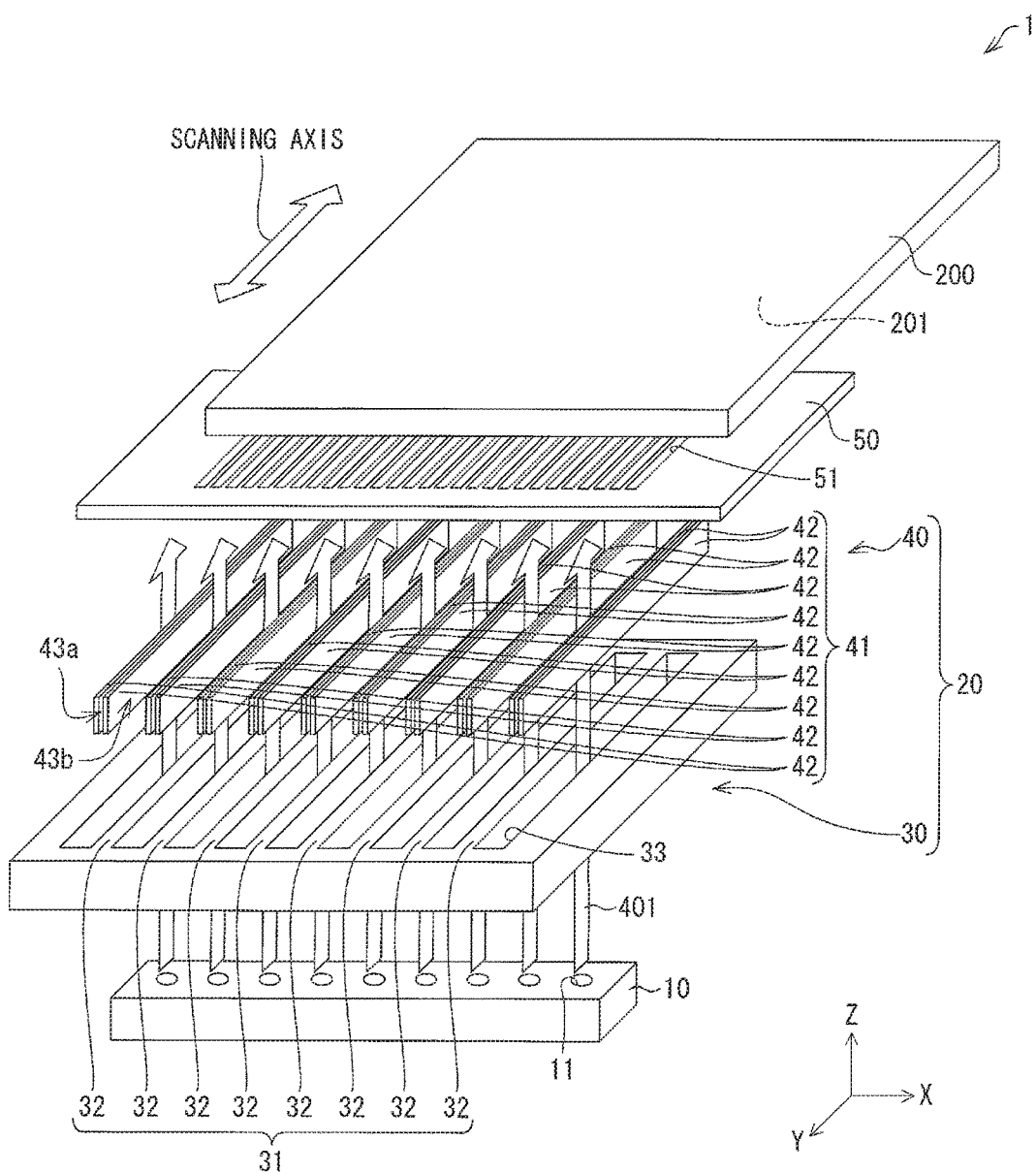
FIG. 2 is a perspective view schematically illustrating a configuration of a substantial part of the vapor deposition unit in accordance with Embodiment 1 together with a film formation target substrate.

FIG. 1 is a cross-sectional view schematically illustrating, together with a film formation target substrate 200, a configuration of substantial part of a vapor deposition unit 1 included in a vapor deposition device 100 (see FIG. 5) in accordance with the present embodiment. FIG. 2 is a perspective view schematically illustrating a configuration of a substantial part of the vapor deposition unit 1 together with the film formation target substrate 200.

Note that the following description assumes that (i) a Y axis is a horizontal axis extending in a scanning direction (scanning axis) of the film formation target substrate 200, (ii) an X axis is a horizontal axis extending in a direction perpendicular to the scanning direction of the film formation target substrate 200, and (iii) a Z axis is a vertical axis which is perpendicular to each of the X axis and the Y axis, which is normal to a vapor deposition target surface 201 (film formation target surface) of the film formation target substrate 200, and in which a vapor deposition axis orthogonal to the vapor deposition target surface 201 extends. Note also that, for convenience of description, the following description assumes that the arrow side in a Z axis direction (upper side in the drawing of FIG. 1) is "an upper side", unless otherwise particularly mentioned.

The vapor deposition unit 1 of the present embodiment, as illustrated in FIGS. 1 and 2, includes (i) a vapor deposition source 10, (ii) a vapor deposition mask 50, and (iii) a limiting plate unit 20 provided between the vapor deposition source 10 and the vapor deposition mask 50.

The limiting plate unit 20 includes a plurality of limiting plate stages each including limiting plates that constitute a limiting plate assembly. The limiting plate unit 20, in other words, includes a plurality of limiting plate assemblies arranged in the Z axis direction. The limiting plate unit 20 of the present embodiment, as illustrated in FIGS. 1 and 2, includes two limiting plate assemblies, namely a first limiting plate assembly 30 and a second limiting plate assembly 40.

The vapor deposition source 10, the first limiting plate assembly 30, the second limiting plate assembly 40, and the vapor deposition mask 50 are arranged in this order from the vapor deposition source 10 side in the Z axis direction so as to, for example, face each other with predetermined gaps therebetween (that is, separated from each other by predetermined distances).

The vapor deposition device 100 uses a scanning vapor-deposition method. Thus, the vapor deposition device 100 is configured such that at least one of the film formation target substrate 200 and the vapor deposition unit 1 is moved (scanned) with respect to the other with a predetermined gap secured between the vapor deposition mask 50 and the film formation target substrate 200.

With the above configuration, relative positions of the vapor deposition source 10, the first limiting plate assembly 30, the second limiting plate assembly 40, and the vapor deposition mask 50 are fixed. Thus, the vapor deposition source 10, the first limiting plate assembly 30, the second limiting plate assembly 40, and the vapor deposition mask 50 may, for example, be (i) held by a holding member (not shown) such as a single holder (see the holder 60 illustrated in FIG. 5) or (ii) integrated with each other.

The vapor deposition source 10 is a container containing, for example, a vapor deposition material. The vapor deposition source 10 may be a container directly containing a vapor deposition material, or may alternatively include a load-lock pipe so that a vapor deposition material is externally supplied to the vapor deposition source 10.

As illustrated in FIG. 2, the vapor deposition source 10 has, for example, a rectangular shape. The vapor deposition source 10, as illustrated in FIGS. 1 and 2, has a top surface (that is, a surface facing the first limiting plate assembly 30) having a plurality of emission holes 11 (through holes, nozzles) from which vapor deposition particles 401 are emitted. The plurality of emission holes 11 are arranged at a predetermined pitch in an X axis direction (first direction; a direction perpendicular to the scanning direction).

The vapor deposition source 10 generates vapor deposition particles 401 in the form of a gas by heating a vapor deposition material so that the vapor deposition material is evaporated (in a case where the vapor deposition material is a liquid material) or sublimated (in a case where the vapor deposition material is a solid material). The vapor deposition source 10 emits, from the emission holes 11 toward the first limiting plate assembly 30, the gaseous vapor deposition material as vapor deposition particles 401.

FIGS. 1, 2, and 5 each illustrate an example case in which (i) there is provided a single vapor deposition source 10 along the X axis direction and (ii) that single vapor deposition source 10 has a plurality of emission holes 11. There is, however, no particular limit to the number of vapor deposition sources 10 provided along the X axis direction or to the number of emission holes 11 that a single vapor deposition source 10 has. For instance, there may be provided a plurality of vapor deposition sources 10 along the X axis direction. Further, a single vapor deposition source 10 simply needs to have at least one emission hole 11.

Further, the emission holes 11 may be arranged one-dimensionally (that is, in a linear manner) in the X axis direction as illustrated in FIG. 2 or two-dimensionally (that is, in a planar manner [so as to be tiled]).

The vapor deposition mask 50 is, as illustrated in FIGS. 1, 2, and 5, a plate-shaped member, and has a mask surface, which is a principal surface (that is, a surface having the largest area) of the vapor deposition mask 50 and which is parallel to an XY plane. Scan vapor deposition is carried out by using, as the vapor deposition mask 50, a vapor deposition mask that is smaller in size at least in a Y axis direction than the film formation target substrate 200.

The principal surface of the vapor deposition mask 50 has a plurality of mask openings 51 (openings; through holes) through which vapor deposition particles 401 pass during vapor deposition. The plurality of mask openings 51 are arranged so as to correspond to a pattern of a part of a target vapor deposition area of the film formation target substrate 200 so that vapor deposition particles 401 do not adhere to the other area of the film formation target substrate 200. Only the vapor deposition particles 401 that have passed through the plurality of mask openings 51 reach the film formation target substrate 200, so that a vapor-deposited film 402 having a pattern corresponding to the plurality of mask openings 51 is formed on the film formation target substrate 200.

Note that luminescent layers of an organic EL display device that are made of the vapor deposition material are vapor-deposited for each color of the luminescent layers during an organic EL vapor deposition process.

Figure 3:
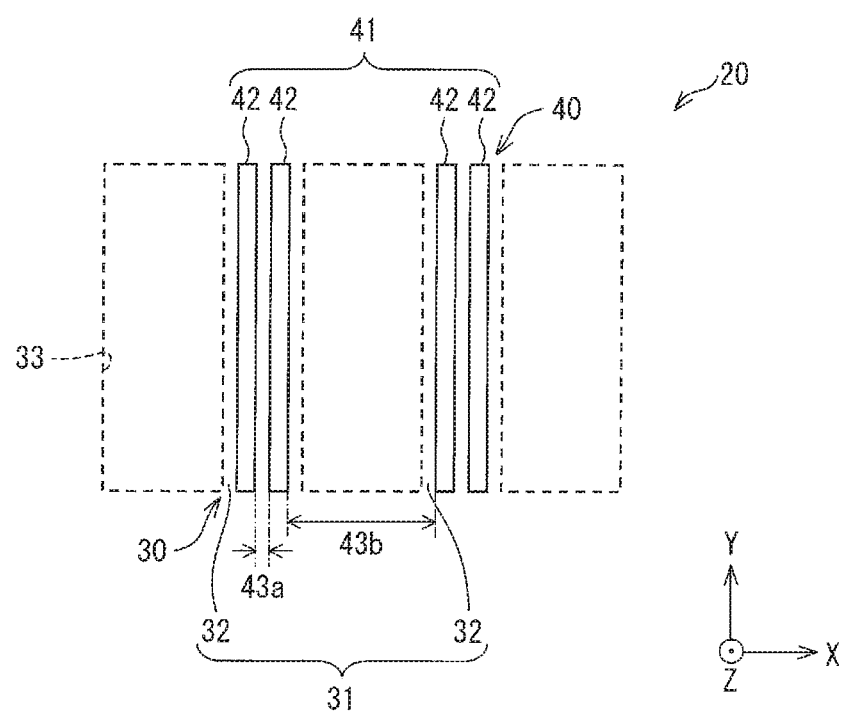
FIG. 3 is a plan view schematically illustrating a configuration of a substantial part of a limiting plate unit in accordance with Embodiment 1.

FIG. 3 is a plan view schematically illustrating a configuration of a substantial part of the limiting plate unit 20.

The limiting plate unit 20, as illustrated in FIGS. 1 through 3 and 5, includes a first limiting plate assembly 30 and a second limiting plate assembly 40.

The first limiting plate assembly 30 includes a first limiting plate row 31 including a plurality of first limiting plates 32 that are provided away from each other in the X axis direction (first direction) and that are parallel to each other.

The second limiting plate assembly 40 includes, directly above the first limiting plates 32, a second limiting plate row 41 including a plurality of second limiting plates 42 that are provided away from each other in the X axis direction (first direction) and that are parallel to each other along the first limiting plates 32.

The first limiting plates 32 and the second limiting plates 42 each have a principal surface on a YZ plane. The respective principal surfaces of the first limiting plates 32 and second limiting plates 42 are adjacent to each other in the X axis direction. The first limiting plates 32 and the second limiting plates 42 are so oriented as to be perpendicular to (i) the principal surface of the vapor deposition mask 50 on an XY plane and (ii) the vapor deposition target surface 201 of the film formation target substrate 200.

Thus, in a plan view (in other words, as viewed in a direction perpendicular to the principal surface of the vapor deposition mask 50, that is, in a direction parallel to the Z axis), the plurality of first limiting plates 32 each extend parallel to the Y axis, and are arranged in the X axis direction at an equal pitch and parallel to each other. This arrangement allows limiting plate openings 33 as opening areas to be formed in a plan view between first limiting plates 32 adjacent to each other in the X axis direction.

The present embodiment is arranged such that the first limiting plates 32 are so disposed that the emission holes 11 of the vapor deposition source 10 are each positioned at the middle of a limiting plate opening 33 in the X axis direction. The limiting plate openings 33 are arranged at a pitch larger than that of the mask openings 51 such that as viewed in the direction perpendicular to the principal surface of the vapor deposition mask 50, a plurality of mask openings 51 are positioned between two first limiting plates 32 adjacent to each other in the X axis direction.

The second limiting plates 42 are arranged directly above the first limiting plates 32 such that at least two second limiting plates 42 are arranged in the X axis direction for each of the first limiting plates 32. FIGS. 1 through 3 and 5 each illustrate an example case in which the second limiting plates 42 are arranged directly above the first limiting plates 32 in pairs in the X axis direction along the first limiting plates 32.

Thus, in a plan view, the second limiting plates 42 each extend parallel to the Y axis, and are arranged such that the pairs of second limiting plates 42 are arranged at an equal pitch in the X axis direction and parallel to each other. This configuration allows limiting plate openings 43b as opening areas to be formed between the pairs of second limiting plates 42 which pairs are adjacent to each other in the X axis direction.

Two second limiting plates 42 forming any pair and disposed directly above a first limiting plate 32 in a plan view are provided away from each other. Such two second limiting plates 42 are separated from each other by a limiting plate opening 43a as an opening area.

The present embodiment is configured such that the first limiting plates 32 and the second limiting plates 42 are each in the shape of, for example, a rectangle. The first limiting plates 32 and the second limiting plates 42 are each so oriented vertically as to have a short axis parallel to the Z axis direction. This means that the first limiting plates 32 and the second limiting plates 42 each have a long axis parallel to the Y axis direction (second direction).

FIG. 2 illustrates an example case in which the first limiting plate assembly 30 is a block-like unit that includes first limiting plates 32 adjacent to each other and that has limiting plate openings 33 between those first limiting plates 32.

(a) and (b) of FIG. 4 are each a perspective view schematically illustrating an example configuration of the second limiting plate assembly 40.

The second limiting plate assembly 40 may be, as illustrated in (a) of FIG. 4, a block-like unit including pairs of second limiting plates 42 which pairs are each made up of two second limiting plates 42 separated from each other by a limiting plate opening 43a and which pairs, adjacent to each other, are separated from each other by limiting plate openings 43b. The second limiting plate assembly 40 may alternatively be configured as illustrated in, for example, (b) of FIG. 4.

The second limiting plate assembly 40 illustrated in (b) of FIG. 4 is configured such that the second limiting plates 42, separated from each other by the limiting plate openings 43a and 43b, are held integrally through a method such as welding by a frame-shaped holding body 46 including a pair of first holding members 44 parallel to the X axis direction and a pair of second holding members 45 parallel to the Y axis direction.

The first limiting plate assembly 30 may be configured similarly to the second limiting plate assembly 40 such that the first limiting plates 32, separated from each other by the limiting plate openings 33, are held integrally through a method such as welding by a frame-shaped holding body similar to the holding body 46, the frame-shaped holding body including a pair of first holding members parallel to the X axis direction and a pair of second holding members parallel to the Y axis direction.

In other words, the limiting plates may be, for example, (i) integrated with a holding body holding (supporting) the limiting plates as illustrated in FIG. 2 and (a) of FIG. 4 or (ii) separate from such a holding body as illustrated in (b) of FIG. 4.

The method for holding the first limiting plates 32 and the second limiting plates 42 is not limited to the above method, and may be any method that allows relative positions and orientations of the first limiting plates 32 and second limiting plates 42 to be fixed.

The limiting plate unit 20 partitions a space between the vapor deposition mask 50 and the vapor deposition source 10 into a plurality of vapor deposition spaces, that is, the limiting plate openings 33 and 43b, with use of the first limiting plates 32 and the second limiting plates 42. The limiting plate unit 20, with this configuration, limits the angle at which vapor deposition particles 401 emitted by the vapor deposition source 10 pass through the limiting plate unit 20.

A high vapor deposition density lets vapor deposition flows spread widely. Preventing spread of vapor deposition flows thus requires such spread of vapor deposition flows to be narrowed three-dimensionally.

Vapor deposition particles 401 emitted by the vapor deposition source 10 pass through the limiting plate openings 33, the limiting plate openings 43b, and the mask openings 51 of the vapor deposition mask 50 sequentially to be vapor-deposited onto the film formation target substrate 200.

The first limiting plate assembly 30 and the second limiting plate assembly 40 selectively blocks (captures) vapor deposition particles 401, having entered the first limiting plate assembly 30 and the second limiting plate assembly 40, depending on the entry angle as illustrated in FIG. 1. The first limiting plate assembly 30 and the second limiting plate assembly 40, in other words, captures at least part of vapor deposition particles 401 having collided with the first limiting plates 32 or second limiting plates 42, and thereby limits movement of vapor deposition particles 401 in the direction in which the first limiting plates 32 and the second limiting plates 42 are arranged (that is, the X axis direction and oblique directions).

With the above arrangement, the first limiting plate assembly 30 and the second limiting plate assembly 40 (i) limit, to a predetermined range, the angle at which vapor deposition particles 401 enter the mask openings 51 of the vapor deposition mask 50, and thus (ii) prevent adherence, to the film formation target substrate 200, of vapor deposition particles 401 flying toward the film formation target substrate 200 in oblique directions.

Note that the first limiting plates 32 and the second limiting plates 42 are unheated or are cooled with use of a heat exchanger (not shown) so as to block obliquely scattering vapor deposition components. This arrangement allows the first limiting plates 32 and the second limiting plates 42 to have a temperature lower than the temperature of the emission holes 11 of the vapor deposition source 10 (more strictly, a temperature lower than a vapor deposition particle generation temperature, at which a vapor deposition material turns into gas).

The first limiting plate assembly 30 may thus be provided as necessary with a cooling mechanism 38 (indicated with a chain double-dashed line in FIG. 5) including, for example, a heat exchanger for cooling the first limiting plates 32. Similarly, the second limiting plate assembly 40 may be provided as necessary with a cooling mechanism 48 (indicated with a chain double-dashed line in FIG. 5) including, for example, a heat exchanger for cooling the second limiting plates 42. This arrangement allows the first limiting plates 32 and the second limiting plates 42 to cool and solidify unnecessary vapor deposition particles 401 that are not completely parallel to the direction normal to the film formation target substrate 200. This in turn allows unnecessary vapor deposition particles 401 to be easily captured by the first limiting plates 32 and the second limiting plates 42, and consequently allows the traveling direction of the vapor deposition particles 401 to be closer to the direction normal to the film formation target substrate 200.

A later description will deal with how vapor deposition particles 401 flow (vapor deposition flows) in a case where the limiting plate unit 20 is included in the vapor deposition unit 1 and how the second limiting plates 42 are designed suitably.

The following description will discuss, with reference to FIG. 5, an example of the vapor deposition device 100 including the vapor deposition unit 1.

FIG. 5 is a cross-sectional view schematically illustrating a configuration of a substantial part of the vapor deposition device 100 in accordance with the present embodiment. Note that FIG. 5 illustrates a cross section of the vapor deposition device 100 in accordance with the present embodiment, the cross section extending parallel to the X axis direction.

As illustrated in FIG. 5, the vapor deposition device 100 in accordance with the present embodiment mainly includes a vacuum chamber 101 (film-forming chamber), a substrate holder 102 (substrate holding member), a substrate moving device 103, a vapor deposition unit 1, a vapor deposition unit moving device 104, an alignment checking section such as an image sensor 105, a shutter (not shown), and a control circuit (not shown) for controlling drive of the vapor deposition device 100.

The substrate holder 102, the substrate moving device 103, the vapor deposition unit 1, and the vapor deposition unit moving device 104 among the above members are provided in the vacuum chamber 101.

Note that in the vacuum chamber 101, a vacuum pump (not shown) is provided for vacuum-pumping the vacuum chamber 101 via an exhaust port (not shown) thereof to keep a vacuum in the vacuum chamber 101 during vapor deposition.

The substrate holder 102 is a substrate holding member for holding the film formation target substrate 200. The substrate holder 102 holds the film formation target substrate 200, including members such as a TFT substrate, such that the vapor deposition target surface 201 of the film formation target substrate 200 faces the vapor deposition mask 50 of the vapor deposition unit 1.

The film formation target substrate 200 and the vapor deposition mask 50 are provided in such a manner as to face each other while being spaced from each other by a predetermined distance. Thus, the film formation target substrate 200 and the vapor deposition mask 50 have therebetween a gap having a predetermined height.

For the substrate holder 102, it is preferable to use, for example, an electrostatic chuck. The film formation target substrate 200 fixed to the substrate holder 102 by means of an electrostatic chuck or the like can be held by the substrate holder 102 without being bent by its own weight.

The present embodiment is arranged to carry out scan vapor deposition by, with use of at least one of the substrate moving device 103 and the vapor deposition unit moving device 104, moving the film formation target substrate 200 and the vapor deposition unit 1 relative to each other such that the scanning direction corresponds to the Y axis direction.

The substrate moving device 103 includes, for example, a motor (not shown) and causes a motor drive control section (not shown) to drive the motor so as to move the film formation target substrate 200 held by the substrate holder 102.

The vapor deposition unit moving device 104 includes, for example, a motor (not shown) and causes a motor drive control section (not shown) to drive the motor so as to move the vapor deposition unit 1 relative to the film formation target substrate 200.

The substrate moving device 103 and the vapor deposition unit moving device 104, for example, drive the respective motors (not shown) to carry out positional correction on the basis of (i) alignment markers 52 each disposed in a non-opening region of the vapor deposition mask 50 and (ii) alignment markers 202 each disposed in a non-vapor deposition region of the film formation target substrate 200 so as to correct positional displacement between the vapor deposition mask 50 and the film formation target substrate 200.

The substrate moving device 103 and the vapor deposition unit moving device 104 may each be, for example, a roller moving device or a hydraulic moving device.

The substrate moving device 103 and the vapor deposition unit moving device 104 may each include, for example, (i) a driving section including a motor (XYθ driving motor) such as a stepping motor (pulse motor), a roller, or a gear, and (ii) a drive control section such as a motor drive control section, and may each cause the drive control section to drive the driving section so that the film formation target substrate 200 or the vapor deposition unit 1 is moved. Further, the substrate moving device 103 and the vapor deposition unit moving device 104 may each include a driving section including, for example, an XYZ stage, and may be provided so as to be movable in any of the X axis direction, the Y axis direction, and the Z axis direction.

Note, however, that only at least one of the film formation target substrate 200 and the vapor deposition unit 1 is required to be movable relative to the other. In other words, only at least one of the substrate moving device 103 and the vapor deposition unit moving device 104 is required.

For example, in a case where the film formation target substrate 200 is movable, the vapor deposition unit 1 may be fixed to an inner wall of the vacuum chamber 101. In a case where the vapor deposition unit 1 is movable, the substrate holder 102 may be fixed to the inner wall of the vacuum chamber 101.

The vapor deposition unit 1 includes a vapor deposition source 10, a first limiting plate assembly 30, a second limiting plate assembly 40, a vapor deposition mask 50, a holder 60, a deposition preventing plate 65, and a shutter (not shown). The vapor deposition source 10, the first limiting plate assembly 30, the second limiting plate assembly 40, and the vapor deposition mask 50 are already described above, and are not described here.

FIG. 5 illustrates an example case in which two second limiting plates 42 of any pair are positioned in the vicinity of ends of a first limiting plate 32 positioned directly underneath the pair of limiting plates 42 which ends are opposite to each other in the X axis direction, more specifically, two second limiting plates 42 of any pair each have an edge on the side of an X axis end of the corresponding first limiting plate 32 which edge form a straight line with the X axis end of the corresponding first limiting plate 32.

The holder 60 is a holding member for holding the vapor deposition source 10, the first limiting plate assembly 30, the second limiting plate assembly 40, and the vapor deposition mask 50.

The holder 60 includes, for example, a pair of sliding devices 61 and a plurality of supporting members 62 to support the first limiting plate assembly 30 and the second limiting plate assembly 40 in correspondence therewith.

The sliding devices 61 are provided in such a manner as to face each other at opposite ends of the holder 60 in the X axis direction. The supporting members 62 are provided on respective sides of the sliding devices 61 on which sides the sliding devices 61 face each other. The supporting members 62 can be slidably displaced in the Z axis direction and the X axis direction while facing each other. Movement of the supporting members 62 is controlled by the sliding devices 61 and/or through collaboration between the sliding devices 61 and a limiting plate control device (not shown).

The holder 60 includes, at respective ends of the first limiting plate assembly 30 which ends are opposite to each other in the X axis direction, supporting sections 37 each detachably provided on the corresponding supporting member 62. The holder 60 further includes, at respective ends of the second limiting plate assembly 40 which ends are opposite to each other in the X axis direction, supporting sections 47 each detachably provided on the corresponding supporting member 62. This arrangement allows the first limiting plate assembly 30 and the second limiting plate assembly 40 to be detached from the holder 60, and consequently makes it possible to regularly collect vapor deposition material accumulated on the first limiting plate assembly 30 and the second limiting plate assembly 40.

Note that the vapor deposition material, which is melted or evaporated upon heating, can be easily collected through a heat treatment. The vapor deposition mask 50, which is required to be high in accuracy of dimension such as an opening width and flatness, may be distorted through a heat treatment and thus cannot be heat-treated. However, the first limiting plate assembly 30 and the second limiting plate assembly 40, which are not required to be as high in accuracy of dimension as the vapor deposition mask 50, can be heat-treated, so that the accumulated vapor deposition material can be easily collected. This allows high material utilization efficiency.

The vapor deposition unit 1 is desirably configured such that the holder 60, for example, is provided with a tension mechanism 63 for applying tension to the vapor deposition mask 50. This configuration allows the holder 60 to apply tension to the vapor deposition mask 50 to hold the vapor deposition mask 50 horizontally, and consequently allows the relative positional relationship to be fixed between (i) the vapor deposition mask 50 and (ii) the vapor deposition source 10, the first limiting plate assembly 30, and the second limiting plate assembly 40.

The vapor deposition device 100 is adjusted such that vapor deposition particles 401 from the vapor deposition source 10 scatter within the limits of the vapor deposition mask 50, and may be arranged such that vapor deposition particles scattered outside the vapor deposition mask 50 are appropriately blocked by, for example, a deposition preventing plate 65 (shielding plate).

In order to prevent the vapor deposition particles from flying toward the film formation target substrate 200, it is desirable to use a shutter (not shown) to control whether or not the vapor deposition particles 401 reach the vapor deposition mask 50.

Thus, in order to control whether or not the vapor deposition particles 401 reach the vapor deposition mask 50, a shutter (not shown) may be provided as necessary between, for example, the vapor deposition source 10 and the first limiting plate assembly 30, such that the shutter can be moved back and forth (can be inserted and drawn out) on the basis of a vapor deposition OFF signal or vapor deposition ON signal.

In a case where the shutter is appropriately provided between the vapor deposition source 10 and the first limiting plate assembly 30, it is possible to prevent vapor deposition on a non-vapor deposition region, for which vapor deposition is not intended. Note that the shutter may be provided integrally with the vapor deposition source 10 or separately from the vapor deposition source 10.

With reference to FIG. 1, the description below deals with how vapor deposition particles 401 emitted by the vapor deposition source 10 flow (vapor deposition flows) in the vapor deposition device 100.

Vapor deposition particles 401 (vapor deposition flow) emitted from each emission hole 11 of the vapor deposition source 10 spread isotropically from the emission hole 11. The vapor deposition flow having an isotropic distribution is blocked (captured) at the two ends in the X axis direction by first limiting plates 32. The spread is thus restricted.

The vapor deposition flow, whose spread has been restricted by first limiting plates 32, spreads again after passing through the limiting plate opening 33, which is an opening region between the two first limiting plates 32, due to collision between and/or scattering of the vapor deposition particles 401 which collision and scattering result from a high vapor deposition density at a high vapor deposition rate.

The vapor deposition flow, which has spread after passing through the limiting plate opening 33, is blocked (captured) by second limiting plates 42. The spread is thus restricted again.

The vapor deposition flow, whose spread remains restricted due to the second limiting plates 42, passes through mask openings 51 of the vapor deposition mask 50 to be vapor-deposited onto the film formation target substrate 200.

The present embodiment is arranged such that one of the vapor deposition unit 1 and the film formation target substrate 200 is moved relative to the other in the scan axis direction, which corresponds to the Y axis direction, with use of a moving device (that is, at least one of the substrate moving device 103 and the vapor deposition unit moving device 104) for carrying out such a relative movement. With this arrangement, scanning the film formation target substrate 200 in the scan axis direction (Y axis direction) allows selectively vapor-deposited layers (for example, respective luminescent layers of the individual colors) to be formed.

The description below deals, for comparison with the limiting plate unit 20 of the present embodiment, with a case in which for each first limiting plate 32, there is provided only one second limiting plate 42 smaller than the first limiting plate 32.

Patent Literature 1 discloses, as limiting plate variations, (i) a first blocking wall assembly including a plurality of first blocking walls and (ii) a second blocking wall assembly including a plurality of second blocking walls, the first and second blocking wall assemblies being provided between a vapor deposition source and a vapor deposition mask in such a manner that the first blocking wall assembly and the second blocking wall assembly correspond to each other (see, for example, FIG. 27 of Patent Literature 1).

According to Patent Literature 1, however, there is provided only one second blocking wall (corresponding to the second limiting plate) for each first blocking wall (corresponding to the first limiting plate). The method disclosed in Patent Literature 1 thus fails to make it possible to completely restrict spreading of a vapor deposition flow to opposite sides of the first blocking wall. The description below deals with the reason for the failure.

(a) through (d) of FIG. 6 are each a cross-sectional view illustrating a comparative example in which for each first limiting plate 32, there is provided only one second limiting plate 42 smaller than the first limiting plate 32. FIG. 7 is a cross-sectional view illustrating a comparative example in which for each first limiting plate 32, there is provided only one second limiting plate 42 having a height extending from the top of the first limiting plate 32 to the lower end of the vapor deposition mask 50.

In a case where (i) there is provided only one second limiting plate 42 for each first limiting plate 32, and (ii) that second limiting plate 42 is positioned near the first limiting plate 32 and at the center of the first limiting plate 32 as in Patent Literature 1, it is impossible at a high vapor deposition rate to restrict spread of a vapor deposition flow having passed first limiting plates 32 to opposite sides in the X axis direction as illustrated in (a) of FIG. 6.

In a case where the second limiting plate 42 is positioned on the side of one X axis end of the first limiting plate 32 as illustrated in (b) of FIG. 6, it is impossible at a high vapor deposition rate to restrict spreading of a vapor deposition flow to the other X axis end of the first limiting plate 32.

In the case where for each first limiting plate 32, there is provided only one second limiting plate 42, the second limiting plate 42 is desirably disposed, as illustrated in (c) of FIG. 6, at a position at which vapor deposition flows having passed through respective limiting plate openings 33 adjacent to each other cross each other, that is, in a region in which a line connecting one X axis end of the first limiting plate 32 with a mask opening 51 of the vapor deposition mask 50 which mask opening 51 corresponds to a vapor deposition region (adjacent film formation region) for the emission hole 11 adjacent to the one X axis end crosses a line connecting the other X axis end of the first limiting plate 32 with a mask opening 51 of the vapor deposition mask 50 which mask opening 51 corresponds to a vapor deposition region for the emission hole 11 adjacent to the other X axis end.

In a case where vapor deposition flows spread further as illustrated in (d) of FIG. 6, however, a second limiting plate 42 positioned as illustrated in (c) of 66 will not block (capture) the vapor deposition flows. The case illustrated in (c) of FIG. 6 and the case illustrated in (d) of FIG. 6 show respective second limiting plates 42 disposed at an identical position, but differ from each other in the vapor deposition rate.

In a case where the second limiting plate 42 is lowered in position (brought closer to the corresponding first limiting plate 32) to block the vapor deposition flows illustrated in (d) of FIG. 6, the second limiting plate 42 may not be able to block slightly spreading vapor deposition flows as illustrated in (a) of FIG. 6.

Thus, in order to deal with any vapor deposition flow with use of only one second limiting plate 42 for each first limiting plate 32, there must be provided a second limiting plate 42 having a height extending from the top of the corresponding first limiting plate 32 to the lower end of the vapor deposition mask 50 as illustrated in FIG. 7.

Providing a second limiting plate 42 having a large volume as illustrated in FIG. 7, however, decreases the volume of a space in which vapor deposition particles 401 are scattered, and increases the pressure in the space. This results in vapor deposition particles 401 more probably colliding with each other and being scattered.

The case illustrated in FIG. 7, in particular, has an invariable space volume distribution in the Z axis direction, and involves second limiting plates 42 each so tall as to have an upper end near the vapor deposition mask 50. This configuration forces vapor deposition particles 401 to be contained in spaces defined by the second limiting plates 42, with the result of far more vapor deposition particles 401 being scattered.

In consequence, although vapor deposition flows are limited with use of first limiting plates 32 to have directivity, the vapor deposition flows each unfortunately have an isotropic distribution again as the vapor deposition flows pass between second limiting plates 42. This in turn causes a film formation pattern to spread in a region in which a film is intended to be formed, and thus causes a pattern blur to occur between two film formation regions. This defect leads to such problems as an increased blur width for a vapor-deposited film 402, color mixing between adjacent pixels, entry of vapor deposition particles 401 into an adjacent nozzle region, and uneven light emission due to an uneven film thickness in a pixel.

These comparative examples indicate that for each first limiting plate 32, at least two second limiting plates 42 are needed in the X axis direction to deal with any vapor deposition flow.

The present embodiment is arranged as illustrated in FIGS. 1 through 3 and 5 such that (i) the first limiting plates 32 and the second limiting plates 42 are parallel to each other on a YZ plane and that (ii) the first limiting plates 32 and the second limiting plates 42 form pairs such that for each first limiting plate 32, there are arranged at least two second limiting plates 42 in the X axis direction.

The present embodiment is arranged such that (i) the first limiting plates 32 and the second limiting plates 42 are positioned as above and that (ii) for each first limiting plate 32, there are arranged at least two second limiting plates 42 in the X axis direction. The present embodiment can, with this arrangement, completely restrict spreading of vapor deposition flows to opposite sides in the X axis direction, and allows the second limiting plates 42 to efficiently capture vapor deposition flows having spread after passing through the limiting plate openings 33 between the first limiting plates 32. The present embodiment can therefore prevent film formation abnormalities such as an abnormally patterned film.

The present embodiment is further arranged such that vapor deposition flows having spread after passing through the limiting plate openings 33 between the first limiting plates 32 are blocked (captured) by the second limiting plates 42 and that the vapor deposition flows, whose spread remains restricted, passes through the mask openings 51 of the vapor deposition mask 50 to be vapor-deposited onto the film formation target substrate 200. The present embodiment can, with this arrangement, prevent film formation abnormalities such as vapor deposition particles 401 from an adjacent nozzle (i) entering and being mixed in a normally patterned film or (ii) forming an abnormally patterned film between normally patterned films.

The present embodiment is further arranged such that the second limiting plates 42 are disposed directly above the first limiting plates 32 in a plan view, that is, the second limiting plates 42 are provided in regions narrower than those of the first limiting plates 32. The present embodiment is thus arranged such that the second limiting plates 42 are absent directly above the limiting plate openings 33, and therefore makes it possible to efficiently capture only a component with actually poor directivity without decreasing the vapor deposition rate at all.

The description below deals with a suitable design of the second limiting plates 42.

FIG. 8 is a cross-sectional view illustrating a substantial part of the vapor deposition unit 1 in accordance with the present embodiment, the view illustrating an example suitable arrangement of the second limiting plates 42. FIG. 8 schematically illustrates a configuration of a substantial part of the vapor deposition unit 1 together with the film formation target substrate 200 as in FIG. 1.

The vapor deposition density is high at and near an upper portion of each opening between the first limiting plates 32 (that is, at and near an upper portion of each limiting plate opening 33). This high vapor deposition density causes more vapor deposition particles 401 to be scattered, and thus likely causes vapor deposition flows to spread.

In view of that, two second limiting plates 42 of any pair disposed directly above an identical first limiting plate 32 in a plan view are preferably as far from each other as possible in order to block spread vapor deposition flows. For instance, two second limiting plates 42 of any pair are more preferably positioned at or near respective X axis ends of the first limiting plate 32 directly underneath the pair as illustrated in FIG. 5. In particular, in a case where two second limiting plates 42 of any pair are positioned at least in contact with at least a portion of the respective X axis ends of the first limiting plate 32 directly underneath the pair, more preferably so positioned as to be flush with the respective X axis ends of the first limiting plate 32 directly underneath the pair as illustrated in FIG. 8, those two second limiting plates 42 can efficiently capture vapor deposition flows spreading to the two X axis ends of the first limiting plate 32. The present embodiment can, with this arrangement, more effectively restrict spreading of vapor deposition flows to the two X axis ends of each first limiting plate 32.

In a case where the second limiting plates 42 may block even necessary spread of vapor deposition flows, there is no need to, as illustrated in FIG. 8, position two second limiting plates 42 of any pair (i) so that the X axis ends of each first limiting plate 32 (that is, the opening edges of each first limiting plate 32 that define the limiting plate openings 33) are each flush with an X axis end of a second limiting plate 42 (more specifically, the edge of one of the pair of second limiting plates 42 which edge is on the side of an X axis end of the corresponding first limiting plate 32) or (ii) at least in contact with a portion of the respective X axis ends of the first limiting plate 32 directly underneath the pair.

For instance, in a case where due to design of the vapor deposition mask 50 or a panel to be formed (film formation target substrate 200), there is a need to use even portions of vapor deposition flows which portions are at the opening edges of the first limiting plates 32, the second limiting plates 42 may each have an edge so separated from the opening edge of the corresponding first limiting plate 32 as to allow the use of portions of vapor deposition flows which portions are at the opening edges of the first limiting plates 32.

In other words, the first limiting plates 32 merely choose which region is to be used of a vapor deposition flow emitted from each emission hole 11. The vapor-deposited film 402 has a vapor deposition distribution that is (i) highest at a position directly above the emission hole 11 (nozzle) and that is (ii) lower at a position closer to a position directly above an end of the emission hole 11 (nozzle end).

Normally, the mask openings 51 each use a region in which the vapor deposition distribution is flat, and no mask opening 51 is provided for a portion corresponding to a nozzle end and having a small film thickness, so that such a portion is shielded by the vapor deposition mask 50. However, in a case where the vapor deposition unit 1 is particularly designed such that, for example, the mask openings 51 each have a Y-axis length that is larger toward a nozzle end, it is possible to offset the difference between (i) a film thickness distribution at the center of a nozzle and (ii) a film thickness distribution at an end of the nozzle. In other words, an appropriate mask design makes it possible to effectively use even portions of vapor deposition flows which portions are at the opening edges of the first limiting plates 32.

In scan vapor deposition, a vapor deposition region corresponding to a single nozzle may vary depending on the first limiting plates 32, and in a case where only a uniform and small width of each vapor deposition flow is used, it is necessary to carry out scanning with use of a large number of nozzles. Further, there may be a case where carrying out a single scanning operation is insufficient for vapor deposition on the entire panel (film formation target substrate 200), so that another scanning operation is necessary with the nozzles shifted in position. In such a case, a variation among the nozzles and/or a variation caused by the positional shift of the nozzles (for example, heat history variation) influences the vapor-deposited film formed, with the result of easily visible unevenness in vapor deposition.

However, in the case where as described above, effective use is made of even portions of vapor deposition flows which portions are at the opening edges of the first limiting plates 32, using wider vapor deposition flows allows vapor deposition to be carried out with use of a small number of emission holes 11 (nozzles), and thus advantageously reduces unevenness in vapor deposition.

The second limiting plates 42 illustrated in FIG. 8 are, as viewed in the X axis direction, each shaped as if the second limiting plate 42 is a Z-axis extension of the corresponding first limiting plate 32.

The description below deals with how vapor deposition particles 401 flow differently between (i) a case involving second limiting plates 42 illustrated in FIG. 8 and (ii) a case involving first limiting plates 32 extended in the Z axis direction to be equal in height to the second limiting plates 42.

FIG. 9 is a cross-sectional view illustrating, next to each other, (i) a vapor deposition unit 1 including second limiting plates 42 illustrated in FIG. 8 and (ii) a vapor deposition unit 1 including no second limiting plates 42 and including first limiting plates 32 extended in the Z axis direction to be equal in height to the second limiting plates 42.

FIG. 9 illustrates (i) on the right (right diagram), a vapor deposition unit 1 corresponding to the case involving second limiting plates 42 illustrated in FIG. 8 and (ii) on the left (left diagram), a vapor deposition unit 1 corresponding to the case involving first limiting plates 32 extended in the Z axis direction to be equal in height to the second limiting plates 42. FIG. 9 shows (i) a dotted-line-enclosed region A, which indicates a region in which the second limiting plates 42 are disposed and respective Z-axis extensions of the first limiting plates 32, and (ii) a dotted-line-enclosed region B, which indicates a region which is adjacent to the dotted-line-enclosed region B and in which the first limiting plates 32 and the second limiting plates 42 are absent.

FIG. 9 shows that the respective Z-axis extensions of the first limiting plates 32 in the left diagram occupy a larger proportion of the dotted-line-enclosed region A than the second limiting plates 42 in the right diagram. This indicates that the pressure difference at the boundary between the dotted-line-enclosed region A and the dotted-line-enclosed region B is larger for the vapor deposition unit 1 in the left diagram, in which the first limiting plates 32 are extended in the Z axis direction, than for the vapor deposition unit 1 in the right diagram, which includes second limiting plates 42.

Thus, as a result of the above difference in the pressure difference, in a case where vapor deposition particles 401 have entered the dotted-line-enclosed region B from the dotted-line-enclosed region A, the vapor deposition unit 1 in the left diagram unfortunately lets such vapor deposition particles 401 spread in the dotted-line-enclosed region B, with the result of a film formation pattern being spread, whereas the vapor deposition unit 1 in the right diagram can restrict spread of vapor deposition flows and thus prevent film formation abnormalities.

In a case where the first limiting plates 32 are separated from the second limiting plates 42 by a gap, vapor deposition flows having spread after passing through the limiting plate openings 33 may, depending on the size of the gap, leak through the gap, and such leaking vapor deposition flows may enter an adjacent nozzle region.

The first limiting plates 32 and the second limiting plates 42 are thus preferably as close to each other as possible, most preferably in (close) contact with each other.

The first limiting plates 32 and the second limiting plates 42 may each have any height that is determined as appropriate in correspondence with the distance between the emission holes 11 and the vapor deposition mask 50.

However, excessively tall second limiting plates 42 are not preferable in particular because such second limiting plates 42 will contain vapor deposition flows as illustrated in FIG. 7 and cause more vapor deposition particles to be scattered. Excessively short second limiting plates 42, on the other hand, may not be able to block spread vapor deposition flows sufficiently.

Vapor deposition flows vary easily depending on, for example, the vapor deposition material or vapor deposition rate. It is thus impossible to generally select suitable heights. It is desirable to select appropriate heights in correspondence with the above conditions for greater capturing efficiency.

The second limiting plates 42 may be separated from the vapor deposition mask 50 by any distance. However, in a case where the second limiting plates 42 are, for example, in close contact with the vapor deposition mask 50 or separated from the vapor deposition mask 50 by an extremely small distance, heat may be transferred to the vapor deposition mask 50 via the second limiting plates 42 and cause the vapor deposition mask 50 to be bent if no cooling mechanism is provided for the second limiting plates 42. Even if there is provided a cooling mechanism for the second limiting plates 42, the vapor deposition mask 50 may be bent by radiation heat from the vapor deposition source 10. In this case, the vapor deposition mask 50 may come into contact with and break the second limiting plates 42.

In view of that, the second limiting plates 42 are preferably separated from the vapor deposition mask 50 moderately, and the heights and positions of the first limiting plates 32 and second limiting plates 42 are preferably set so that the second limiting plates 42 are separated from the vapor deposition mask 50.

Further, the second limiting plates 42 preferably occupy as small a volume as possible in the space between the first limiting plates 32 and the vapor deposition mask 50 so that vapor deposition flows having passed through the limiting plate openings 33 will not have a vapor deposition distribution changed due to a sharp pressure change. Thus, the heights of the first limiting plates 32 and second limiting plates 42 are preferably set with the above point as well in mind.

FIG. 10 is a cross-sectional view schematically illustrating a configuration of a substantial part of a vapor deposition unit in accordance with the present variation together with a film formation target substrate.

The present variation is arranged such that as illustrated in FIG. 10, two second limiting plates 42 of any pair disposed directly above a first limiting plate 32 are so inclined as to be separated from each other by an opening width that is smaller toward above. In other words, the second limiting plates 42 are so oriented that two second limiting plates 42 of any pair disposed directly above a first limiting plate 32 form an inverted V shape with the two inclined lines separated from each other by a gap at the center.

The second limiting plates 42 of the present variation are also preferably in contact with the first limiting plates 32 for the reason described above. The second limiting plates 42 of the present variation are further preferably arranged such that the edge of each of the pair of second limiting plates 42 which edge is on the side of an X axis end of the corresponding first limiting plate 32 is positioned at the X axis end of the first limiting plate 32 (that is, the opening edges of each first limiting plate 32 that define the limiting plate openings 33).

The present variation allows a variation in space volume in the Z axis direction as illustrated in FIG. 10. Specifically, the present variation allows the space volume directly above each limiting plate opening 33 between the first limiting plates 32 (specifically, the space volume in each limiting plate opening 43b between second limiting plates 42) to be larger toward the vapor deposition mask 50 (that is, toward above).

The present variation eliminates the need to include second limiting plates 42 each having, as illustrated in FIG. 7, a height extending to a position near the vapor deposition mask 50. Further, the present variation is arranged such that the space volume directly above each limiting plate opening 33 between the first limiting plates 32 is larger toward above. This arrangement can prevent vapor deposition particles 401 from being scattered. The present variation can therefore solve the problem pointed out in FIG. 7, and thus makes it possible to more effectively capture vapor deposition flows having spread after passing through the limiting plate openings 33 between the first limiting plates 32.

(a) through (e) of FIG. 11 are each a plan view illustrating an example pattern of second limiting plates 42 in a substantial part of a limiting plate unit 20 in accordance with the present variation.

FIG. 3 illustrates an example case in which the second limiting plates 42 are (i) disposed directly above the first limiting plates 32 in a plan view, (ii) equal in length in the Y axis direction to the first limiting plates 32, and (iii) continuous in the Y axis direction.

The second limiting plates 42 may alternatively be arranged as illustrated in (a) through (e) of FIG. 11 such that (i) the second limiting plates 42 are shorter in length in the Y axis direction than the first limiting plates 32 and disposed directly above the first limiting plates 32 in a plan view and that (ii) a plurality of second limiting plates 42 are arranged discontinuously in the Y axis direction.

In the above case, while second limiting plates 42 at any individual positions in the X axis direction (for example, second limiting plates 42 adjacent to each other in the X axis direction) have discontinuous portions (each of which is a region between two ends facing each other which ends are of respective second limiting plates 42 adjacent to each other in the Y axis direction), such discontinuous portions do not need to lie at any particular position in the Y axis direction (particular Y coordinate) or share any particular length as illustrated in (b) through (e) of FIG. 11.

Further, in the above case, second limiting plates 42 at any individual positions in the X axis direction do not need to have the same number of discontinuous portions as illustrated in (c) through (e) of FIG. 11. In addition, second limiting plates 42 adjacent to each other in the X axis direction and forming a pair do not need to share the same pattern. Further, different pairs of second limiting plates 42 do not need to share the same pattern either as illustrated in (c) and (d) of FIG. 11.

Including second limiting plates 42 that are discontinuous as illustrated in (a) through (e) of FIG. 11 allows a finer adjustment and facilitates replacement of the second limiting plates 42.

In the above case, in any region in which second limiting plates 42 are provided to form a pair (that is, any region directly above a first limiting plates 32 in a plan view), at least one second limiting plate 42 is preferably present at any position in the Y axis direction (coordinate) as viewed in a direction parallel to the X axis direction (that is, there is no Y coordinate position at which no second limiting plate 42 is present as viewed in the direction parallel to the X axis direction) as illustrated in (d) and (e) of FIG. 11 so that no vapor deposition particle 401 will pass through a discontinuous portion to reach an adjacent film formation region (that is, an adjacent mask opening region).

The above arrangement simply requires the second limiting plates 42 to be so disposed that in any region in which second limiting plates 42 are provided to form a pair, at least one second limiting plate 42 is present at any position in the Y axis direction as viewed in the direction parallel to the X axis direction. The above arrangement thus does not require second limiting plates 42 in the above region to extend over the equal distance in the Y axis direction. Further, the above arrangement does not require the first limiting plates 32 and the second limiting plates 42 to share the equal length in the Y axis direction.

(a) through (e) of FIG. 11 each illustrate an example case in which second limiting plates 42 adjacent to each other in the X axis direction and forming any pair are so positioned as to be separated from respective X axis ends of the first limiting plate 32 directly underneath the pair. In this case also, however, second limiting plates 42 adjacent to each other in the X axis direction and forming any pair are preferably so positioned as to at least have a portion (for example, at least a second limiting plate 42 adjacent to an emission hole 11 in a plan view) in contact with at least a portion of the X axis ends of the first limiting plate 32 directly underneath the pair.

FIG. 12 is a plan view illustrating an example pattern of second limiting plates 42 in a substantial part of a limiting plate unit 20 in accordance with the present variation together with emission holes 11.

As describe above, the vapor-deposited film 402 has a vapor deposition distribution that is (i) highest at a position directly above each emission hole 11 (nozzle) and that is (ii) lower at a position closer to a position directly above an end of the emission hole 11 (nozzle end). Thus, at any position directly above (i) an emission hole 11 and (ii) its vicinity, the vapor deposition density is high, and a large number of vapor deposition particles 401 collide with each other and are scattered.

Thus, the second limiting plates 42 desirably each have a length in the Y axis direction and lie at a position which length and position are determined in view of, for example, the vapor deposition material and vapor deposition density (vapor deposition rate).

Thus, in a case where the second limiting plates 42 are shorter in length in the Y axis direction than the first limiting plates 32, the second limiting plates 42 are preferably each adjacent to an emission hole 11 in a plan view. In this case, the second limiting plates 42 are not necessarily provided discontinuously in the Y axis direction along the first limiting plates 32, and may each be disposed only at a position adjacent to an emission hole 11 in a plan view as illustrated in FIG. 12.

At any position directly above (i) an emission hole 11 and (ii) its vicinity, the vapor deposition density is high, a large number of vapor deposition particles 401 collide with each other and are scattered, and vapor deposition flows are thus likely to have poor directivity. As such, second limiting plates 42 are desirably provided at positions each directly above (i) an emission hole 11 and (ii) its vicinity. At any position far from an emission hole 11, on the other hand, the vapor deposition density is low, a small number of vapor deposition particles 401 collide with each other and are scattered, and vapor deposition flows are thus unlikely to have poor directivity. As such, second limiting plates 42 are not necessarily provided at positions each far from an emission hole 11 in a plan view.

The configuration illustrated in FIG. 12 allows second limiting plates 42 to be provided only at necessary positions, and is therefore inexpensive.

FIG. 12 illustrates an example case in which second limiting plates 42 forming any pair are so positioned as to be separated from respective X axis ends of the first limiting plate 32 directly underneath the pair. In this case also, however, second limiting plates 42 forming any pair are preferably so positioned as to be in contact with respective X axis ends (specifically, a portion of the X axis ends) of the first limiting plate 32 directly underneath the pair (more specifically, so positioned as to be flush with a portion of the X axis ends).

FIG. 13 is a plan view illustrating an example pattern of second limiting plates 42 in a substantial part of a limiting plate unit 20 in accordance with the present variation together with emission holes 11.

The present embodiment (in particular, FIG. 3, (a) through (e) of FIG. 11, and FIG. 12) is described as example cases involving rectangular-parallelepiped second limiting plates 42. The second limiting plates 42 are, however, not necessarily in the shape of a rectangular parallelepiped.

For example, the second limiting plates 42 may each have, in a plan view, tapering ends in the Y axis direction in view of the difference in the vapor deposition density in a plan view between a region at and near any emission hole 11 and the remaining region.

The second limiting plates 42 preferably occupy only a small volume so that a sharp pressure change will not change the distribution of vapor deposition flows having passed through the limiting plate openings 33 between the first limiting plates 32. Including second limiting plates 42 shaped as illustrated in FIG. 13 can reduce the change in the distribution of vapor deposition flows having passed through the limiting plate openings 33 (that is, in the vapor deposition distribution of a vapor-deposited film 402 to be formed), and thus allows control to be carried out with higher accuracy.

FIG. 13, as well as FIG. 12, illustrates an example case in which second limiting plates 42 forming any pair are so positioned as to be separated from respective X axis ends of the first limiting plate 32 directly underneath the pair. In this case also, however, second limiting plates 42 forming any pair are preferably so positioned as to be in contact with respective X axis ends (specifically, a portion of the X axis ends) of the first limiting plate 32 directly underneath the pair.

The present embodiment is described with reference to drawings as example cases in each of which the second limiting plates 42 have an equal height. The second limiting plates 42, however, do not necessarily have an equal height.

The emission holes 11 (nozzles) have an individual difference, so that respective vapor deposition distributions corresponding to the emission holes 11 have a difference as well. Thus, the height of the second limiting plates 42 (that is, the length in the Z axis direction) may be fine-adjusted to reduce the individual difference of the emission holes 11.

The present embodiment is described below with reference to FIGS. 14 and 15.

The description below will deal mainly with how the present embodiment differs from Embodiment 1. Any member of the present embodiment that is identical in function to a corresponding member of Embodiment 1 is assigned a common reference numeral, and is not described here.

In a case where spread of vapor deposition flows that is due to collision between and scattering of vapor deposition particles 401 is relatively small, arranging two second limiting plates 42 in the X axis direction for each first limiting plate 32 will sufficiently prevent film formation abnormalities.

In a case where spread of vapor deposition flows is extremely large, however, merely arranging two second limiting plates 42 in the X axis direction for each first limiting plate 32 may, depending on the size and/or arrangement of the second limiting plates 42, fail to produce a sufficient effect of capturing vapor deposition particles 401 that can cause film formation abnormalities, for example, (i) fail to capture vapor deposition flows spreading beyond the position at which second limiting plates 42 are arranged or (ii) in a case where second limiting plates 42 are arranged closer to the center of the corresponding first limiting plate 32 to capture vapor deposition flows spreading beyond the position at which second limiting plates 42 are arranged, fail to capture vapor deposition flows outside the position at which second limiting plates 42 are arranged.

In view of that, as an example measure for a case in which spread of vapor deposition flows is extremely large, in a case where the first limiting plates 32 and the second limiting plates 42 are not in close contact with each other, the second limiting plates 42 may, for example, each have a larger length in the X axis direction (in other words, a larger width) as illustrated in FIG. 15 to block (capture) vapor deposition flows spreading through a gap between the first limiting plates 32 and the second limiting plates 42.

Increasing the width (thickness in the X axis direction) of each second limiting plate 42 as illustrated in FIG. 15 can restrict vapor deposition flows spreading after passing through the limiting plate openings 33 between the first limiting plates 32.

In this case, however, the increased width of each second limiting plate 42 results in the second limiting plates 42 being heavier accordingly and the alignment accuracy being decreased. Further, since the second limiting plates 42 occupy a larger volume, vapor deposition flows having passed the second limiting plates 42 are subjected to a sharp pressure change. This indicates that the second limiting plates 42 preferably each have a width in the X axis direction which width is relatively small with respect to the width of each first limiting plate 32 in the X axis direction.

For instance, even with the second limiting plates 42 each having a relatively small width in the X axis direction, in a case where it is possible to provide, at each of the two X axis ends of each first limiting plate 32, a second limiting plate 42 having a relatively large length in the Z axis direction, arranging two second limiting plates 42 in the X axis direction for each first limiting plate 32 can sufficiently prevent film formation abnormalities.

However, there are cases where it is impossible to have a space with a sufficient height (that is, the distance between the first limiting plates 32 and the vapor deposition mask 50) for the second limiting plates 42, and there is no choice but to use second limiting plates 42 each having a length in the Z axis direction which length is small for the size of spread of vapor deposition flows. In such cases, even in the case where the second limiting plates 42 are provided at the two X axis ends of each first limiting plate 32, if the first limiting plates 32 are separated from the second limiting plates 42 by a gap, vapor deposition flows may leak into (enter) an adjacent film formation region from the gap between the first limiting plates 32 and the second limiting plates 42 through gaps between second limiting plates 42 at the X axis ends.

In a case where the second limiting plates 42 each have a large length in the Z axis direction to capture vapor deposition flows, the volume of a space in which vapor deposition particles 401 are scattered is decreased, and the pressure in the space rises as a result. This indicates that even in the case where it is possible to have a space with a sufficient height for the second limiting plates 42, it may be difficult, depending on the size of spread of vapor deposition flows, to provide second limiting plates 42 each having a length sufficient to deal with the size of spread of vapor deposition flows.

FIG. 14 is a cross-sectional view schematically illustrating a configuration of a substantial part of the vapor deposition unit 1 in accordance with the present embodiment together with a film formation target substrate 200.

The vapor deposition unit 1 illustrated in FIG. 14 is identical to the vapor deposition unit 1 of Embodiment 1 except that in a case where the first limiting plates 32 and the second limiting plates 42 are not in close contact with each other, there are provided, for each first limiting plate 32, three second limiting plates 42 each having a length in the Z axis direction which length is shorter than that for Embodiment 1.

The present embodiment is arranged such that as indicated with the bold broken lines in FIG. 14, vapor deposition flows that cannot be captured by second limiting plates 42 provided at the X axis ends of each first limiting plate 32 are captured by a second limiting plate 42 provided at the X-axis center of the first limiting plate 32. The present embodiment can therefore sufficiently prevent film formation abnormalities even in the case where the second limiting plates 42 each have a length in the Z axis direction which length is small for spread of vapor deposition flows.

As described above, the present embodiment is arranged such that by providing three second limiting plates 42 for each first limiting plate 32, in particular, by providing three second limiting plates 42 for each first limiting plate 32 in the case where the first limiting plates 32 and the second limiting plates 42 are not in close contact with each other as illustrated in FIG. 14, it is possible to capture even vapor deposition flows spreading extremely greatly (that is, vapor deposition flows spreading through the gap between the first limiting plates 32 and the second limiting plates 42) without decreasing the alignment accuracy or causing a sharp pressure change to vapor deposition flows having passed the first limiting plates 32.

FIG. 14 illustrates an example case in which there are provided three second limiting plates 42 for each first limiting plate 32. The present embodiment is, however, not limited to such an arrangement, and there may be more than three second limiting plates 42 for each first limiting plate 32 depending on the spread of vapor deposition flows. However, providing an excessively large number of second limiting plates 42 for each first limiting plate 32 is not preferable because (i) aligning such a large number of second limiting plates 42 appropriately to form a pattern with high definition will be complicating, and (ii) those second limiting plates 42 will occupy a larger volume.

FIG. 14 illustrates an example case in which the first limiting plates 32 and the second limiting plates 42 are not in close contact with each other. The present embodiment is, however, not limited to such an arrangement. The first limiting plates 32 and the second limiting plates 42 may be in close contact with each other.

For instance, in a case where there is provided, between two second limiting plates 42 provided at the respective X axis ends of each first limiting plate 32, a second limiting plate 42 protruding in the Z axis direction compared to the two second limiting plates 42 at the respective X axis ends (for example, a second limiting plate 42 larger in length in the Z axis direction than the two second limiting plates 42 at the respective X axis ends), it is possible, regardless of whether the first limiting plates 32 and the second limiting plates 42 are in close contact with each other, to capture vapor deposition flows, which were not captured by two second limiting plates 42 provided at the respective X axis ends, with use of the second limiting plate 42 provided between the two second limiting plates 42 at the respective X axis ends.

In this case also, there is no particular limit to the number of second limiting plates 42 provided between the two second limiting plates 42 at the respective X axis ends. For example, there may be provided, between the two second limiting plates 42 at the respective X-axis ends, (i) only one second limiting plate 42 at the X axis center of each first limiting plate 32 or (ii) two or more second limiting plates 42 provided away from each other.

In this case, the second limiting plate 42 provided between the two second limiting plates 42 at the respective X axis ends has any height that is, for example, set as appropriate depending on the vapor deposition material used, the vapor deposition rate, and/or the like so that the capturing efficiency will be increased and that a decrease in the volume of a space in which vapor deposition particles 401 are scattered will not cause the pressure in the space to rise excessively.

It is needless to say that the second limiting plates 42 may vary to employ any of the ideas discussed for Embodiment 1.

The present embodiment is described below with reference to FIGS. 16 through 20.

The description below will deal mainly with how the present embodiment differs from Embodiments 1 and 2. Any member of the present embodiment that is identical in function to a corresponding member of Embodiment 1 or 2 is assigned a common reference numeral, and is not described here.

Embodiment 2 is described above as an example case of increasing the number of second limiting plates 42 positioned on an identical YZ plane and directly above an identical first limiting plate 32 in a plan view (that is, the number of second limiting plates 42 for each first limiting plate) to, in a case where spread of vapor deposition flows is large, block (capture) vapor deposition particles 401 spreading after passing through the limiting plate openings 33 between the first limiting plates 32.

However, in the case where the number of second limiting plates 42 for each first limiting plate 32 is increased, a group of second limiting plates 42 occupy a larger volume on the identical YZ plane, and the total number of second limiting plates 42 is increased. Increasing the number of second limiting plates 42 for each first limiting plate 32 will more likely cause a sharp pressure change or complicate the alignment carried out for increased alignment accuracy.

In view of that, the present embodiment is an example case in which there are provided, between the first limiting plate assembly 30 and the vapor deposition mask 50, multiple stages of limiting plates including the second limiting plates 42.

FIG. 16 is a cross-sectional view schematically illustrating a configuration of a vapor deposition unit 1 including a second limiting plate assembly 40 and a third limiting plate assembly 70 between a first limiting plate assembly 30 and a vapor deposition mask 50.

As illustrated in FIG. 16, the third limiting plate assembly 70 includes, directly above the first limiting plates 32, a third limiting plate row 71 including a plurality of third limiting plates 72 that are provided away from each other in the X axis direction and that are parallel to each other along the first limiting plates 32.

Similarly to the second limiting plates 42, the third limiting plates 72 each have a principal surface on a YZ plane. The respective principal surfaces of the third limiting plates 72 are adjacent to each other in the X axis direction. The third limiting plates 72 are so oriented as to be perpendicular to (i) the principal surface of the vapor deposition mask 50 on an XY plane and (ii) the vapor deposition target surface 201 of the film formation target substrate 200.

FIG. 16 illustrates an example case in which the third limiting plates 72 are, similarly to the second limiting plates 42, arranged directly above the first limiting plates 32 in pairs in the X axis direction along the first limiting plates 32.

Thus, in a plan view, the third limiting plates 72 each extend parallel to the Y axis, and are arranged such that the pairs of third limiting plates 72 in the X axis direction are arranged at an equal pitch in the X axis direction and parallel to each other. This configuration allows limiting plate openings 73b as opening areas to be formed between the pairs of third limiting plates 72 which pairs are adjacent to each other in the X axis direction.

Two third limiting plates 72 forming any pair and disposed directly above an identical first limiting plate 32 in a plan view are provided away from each other. Such two third limiting plates 72 are separated from each other by a limiting plate opening 73a as an opening area.

The present embodiment is configured such that the third limiting plates 72 are each in the shape of, for example, a rectangle. The third limiting plates 72 are each so oriented vertically as to have a short axis parallel to the Z axis direction. This means that the third limiting plates 72 each have a long axis parallel to the Y axis direction.

The third limiting plate assembly 70 may be, similarly to the second limiting plate assembly 40 illustrated in (a) of FIG. 4, a block-like unit including pairs of third limiting plates 72 which pairs are each made up of two third limiting plates 72 separated from each other by a limiting plate opening 73a and which pairs, adjacent to each other, are separated from each other by limiting plate openings 73b. The third limiting plate assembly 70 may, for example, alternatively be configured, similarly to the second limiting plate assembly 40 illustrated in (b) of FIG. 4, such that the third limiting plates 72, separated from each other by the limiting plate openings 73a and 73b, are held integrally through a method such as welding by a frame-shaped holding body similar to the holding body 46 which frame-shaped holding body includes a pair of first holding members parallel to the X axis direction and a pair of second holding members parallel to the Y axis direction.

The method for holding the third limiting plates 72 is not limited to the above method for the present variation as well, and may be any method that allows relative positions and orientations of the third limiting plates 72 to be fixed.

The third limiting plate assembly 70 partitions a space between the second limiting plate assembly 40 and the vapor deposition mask 50 into a plurality of vapor deposition spaces, that is, the limiting plate openings 73b, with use of the third limiting plates 72. The third limiting plate assembly 70, with this configuration, limits the angle at which vapor deposition particles 401 having passed through the limiting plate openings 43b between the second limiting plates 42 pass through the third limiting plate assembly 70.

The present embodiment is arranged as illustrated in FIG. 16 such that (i) the first limiting plate assembly 30, the second limiting plate assembly 40, and the third limiting plate assembly 70 are provided away from each other in this order from the vapor deposition source 10 side and that (ii) for each first limiting plate 32, there are two second limiting plates 42 arranged in the X axis direction and two third limiting plates 72 arranged in the X axis direction.

Such two second limiting plates 42 are positioned close to the X axis center of the corresponding first limiting plate 32 in order to capture vapor deposition flows spreading extremely greatly after passing through the limiting plate openings 33 between the first limiting plates 32 (for example, vapor deposition flows that will spread beyond the arrangement of second limiting plates 42 in a case where the second limiting plates 42 are positioned close to the X axis ends of each first limiting plate 32).

Further, the third limiting plates 72 are, as compared to the second limiting plates 42, so positioned close to the X axis ends of each first limiting plate 32 as to be present on paths of vapor deposition flows (that is, paths on which vapor deposition particles 401 fly) passing outside the arrangement position of the second limiting plates 42 (for example, vapor deposition flows crossing each other above the second limiting plates 42 [on the vapor deposition mask 50 side]) as a result of the second limiting plates 42 being positioned close to the X axis center of each first limiting plate 32.

The present embodiment, with the above configuration, uses (i) the second limiting plate row 41 (group of second limiting plates 42) at the lower stage to capture vapor deposition flows having relatively large spread and (ii) the third limiting plate row 71 (group of third limiting plates 72) at the upper stage to capture vapor deposition flows having relatively small spread.

The present embodiment, as described above, allows the individual limiting plate stages to capture vapor deposition particles 401 in respective different ranges to achieve respective separate functions depending on the degree of spread of vapor deposition flows. This configuration makes it possible to capture spread vapor deposition flows without increasing the number of limiting plates on an identical YZ plane. The above configuration can further prevent the volume occupied by the second limiting plates 42 from increasing due to an increase in the number of second limiting plates 42 occupying an identical YZ plane.

The present embodiment therefore makes it possible to (i) position the second limiting plates 42 accurately with respect to any spread of vapor deposition flows and (ii) prevent a pressure change after the passage through the limiting plate openings 33, thereby effectively preventing film formation abnormalities.

The present embodiment is an example case in which the limiting plate stages are separate limiting plate assemblies. The present embodiment may, however, alternatively be configured such that the second limiting plate assembly 40 includes multiple limiting plate stages. Specifically, the present embodiment may be configured, for example, such that (i) the second limiting plates 42 at the lower stage and the third limiting plates 72 at the upper stage are held by a single holding body and that (ii) the second limiting plate assembly 40 includes second limiting plates 42 and third limiting plates 72.

At any stage directly above the first limiting plates 32, the number of limiting plates arranged in the X axis direction for each first limiting plate 32 is not limited to two, and may be one (1) or three or more.

The number of limiting plates for each first limiting plate for each first limiting plate 32 may be equal or different between the individual stages.

FIG. 17 is a cross-sectional view schematically illustrating an example configuration of a vapor deposition unit 1 in accordance with the present variation.

FIG. 17 illustrates an example case in which for each first limiting plate 32, there are two second limiting plates 42 and a single third limiting plate 72 arranged in the X axis direction.

In FIG. 17 as well, two second limiting plates 42 are positioned close to the X axis center of the corresponding first limiting plate 32 in order to capture vapor deposition flows spreading extremely greatly after passing through the limiting plate openings 33 between the first limiting plates 32 (for example, vapor deposition flows that will spread beyond the arrangement of second limiting plates 42 in a case where the second limiting plates 42 are positioned close to the X axis ends of each first limiting plate 32).

FIG. 16 illustrates a case in which there are two third limiting plates 72 so arranged in the X axis direction and above any position at which vapor deposition flows cross each other above the second limiting plates 42 (that is, on the vapor deposition mask 50 side) that the third limiting plates 72 are present on paths of vapor deposition flows passing outside the arrangement position of the second limiting plates 42. In a case where there is only one third limiting plate 72 disposed directly above each first limiting plate 32 as in FIG. 17, the third limiting plate 72 is preferably present at the crossing position as illustrated in FIG. 17.

The above configuration makes it possible to effectively capture, with use of a single third limiting plate 72, vapor deposition flows passing outside the arrangement position of the second limiting plates 42.

The present variation is configured such that the third limiting plates 72 are disposed directly above the first limiting plates 32 such that only one third limiting plate 72 is provided for each first limiting plate 32. The third limiting plates 72 adjacent to each other in the X axis direction are thus separated from each other by limiting plate openings 73 as opening areas.

The third limiting plate assembly 70 partitions a space between the second limiting plate assembly 40 and the vapor deposition mask 50 into a plurality of vapor deposition spaces, that is, the limiting plate openings 73, with use of the third limiting plates 72. The third limiting plate assembly 70, with this configuration, limits the angle at which vapor deposition particles 401 having passed through the limiting plate openings 43b between the second limiting plates 42 pass through the third limiting plate assembly 70.

FIGS. 16 and 17 each illustrate an example case in which there are two limiting plate stages between the first limiting plate assembly 30 and the vapor deposition mask 50. There may be, however, three or more limiting plate stages between the first limiting plate assembly 30 and the vapor deposition mask 50. There may be, in other words, three or more limiting plate assemblies between the first limiting plate assembly 30 and the vapor deposition mask 50.

In a case where (i) a vapor deposition unit 1 includes a plurality of stages of limiting plate assemblies arranged in the Z axis direction, and (ii) the limiting plate assemblies each include a plurality of limiting plates, the vapor deposition unit 1 can be easily made suitable for any substrate size, pattern size, material, or the like.

In a case where, for instance, the vapor deposition rate is higher than the respective cases illustrated in FIGS. 16 and 17, vapor deposition flows having passed through the limiting plate openings 33 between the first limiting plates 32 may spread further immediately after passing through the limiting plate openings 43b between the second limiting plates 42.

In view of that, there may be additional limiting plates arranged in the Z axis direction to capture vapor deposition flows spreading, depending on the vapor deposition rate, after passing through the limiting plate openings 43b.

FIG. 18 is a cross-sectional view schematically illustrating an example configuration of a vapor deposition unit 1 in accordance with the present variation. (a) and (b) of FIG. 19 are each a cross-sectional view illustrating an example manner of arranging limiting plates of each stage in accordance with the present variation.

FIG. 18 illustrates a case in which there is a fourth limiting plate assembly 80 between the third limiting plate assembly 70 and the vapor deposition mask 50.

The fourth limiting plate assembly 80 is identical in schematic configuration to the third limiting plate assembly 70 except that the fourth limiting plate assembly 80 is disposed between the third limiting plate assembly 70 and the vapor deposition mask 50. As illustrated in FIG. 18, the fourth limiting plate assembly 80 includes, directly above the first limiting plates 32, a fourth limiting plate row 81 including a plurality of fourth limiting plates 82 that are provided away from each other in the X axis direction and that are parallel to each other along the first limiting plates 32.

Similarly to the third limiting plates 72, the fourth limiting plates 82 each have a principal surface on a YZ plane. The respective principal surfaces of the fourth limiting plates 82 are adjacent to each other in the X axis direction. The fourth limiting plates 82 are so oriented as to be perpendicular to (i) the principal surface of the vapor deposition mask 50 on an XY plane and (ii) the vapor deposition target surface 201 of the film formation target substrate 200.

FIG. 18 illustrates an example case in which the fourth limiting plates 82 are, similarly to the third limiting plates 72, arranged directly above the first limiting plates 32 in pairs in the X axis direction along the first limiting plates 32.

Thus, in a plan view, the fourth limiting plates 82 each extend parallel to the Y axis, and are arranged such that the pairs of fourth limiting plates 82 in the X axis direction are arranged at an equal pitch in the X axis direction and parallel to each other. This configuration allows limiting plate openings 83b as opening areas to be formed between the pairs of fourth limiting plates 82 which pairs are adjacent to each other in the X axis direction.

Two fourth limiting plates 82 forming any pair and disposed directly above a first limiting plate 32 in a plan view are provided away from each other. Such two fourth limiting plates 82 are separated from each other by a limiting plate opening 83a as an opening area.

The present variation is configured such that the fourth limiting plates 82 are each in the shape of, for example, a rectangle. The fourth limiting plates 82 are each so oriented vertically as to have a short axis parallel to the Z axis direction. This means that the fourth limiting plates 82 each have a long axis parallel to the Y axis direction.

The fourth limiting plates 82 can be held through a method similar to the method for holding the third limiting plates 72. However, the fourth limiting plates 82 may be held, similarly to the third limiting plates 72, through any method that allows relative positions and orientations of the fourth limiting plates 82 to be fixed.

The fourth limiting plate assembly 80 partitions a space between the third limiting plate assembly 70 and the vapor deposition mask 50 into a plurality of vapor deposition spaces, that is, the limiting plate openings 83b, with use of the fourth limiting plates 82. The fourth limiting plate assembly 80, with this configuration, limits the angle at which vapor deposition particles 401 having passed through the limiting plate openings 73b between the third limiting plates 72 pass through the fourth limiting plate assembly 80.

FIG. 18 illustrates a case in which for each first limiting plate 32, there are two second limiting plates 42 arranged in the X axis direction, two third limiting plates 72 arranged in the X axis direction, and two fourth limiting plates 82 arranged in the X axis direction.

In a case where there are multiple limiting plate stages arranged in the Z axis direction as illustrated in FIG. 18, the opening edges of any first limiting plate 32 that define the limiting plate openings 33 are preferably at least partially in contact (for example, flush) with the edges of the corresponding pair of second limiting plates 42 which edges are on the side of the X axis ends of the first limiting plate 32 as described for Embodiment 1.

Further, in a case where there are multiple limiting plate stages arranged in the Z axis direction as illustrated in FIG. 18, the vapor deposition unit 1 is preferably configured such that (i) limiting plates (namely, second limiting plates 42, third limiting plates 72, and fourth limiting plates 82) disposed directly above any first limiting plate 32 in a plan view are in contact at least partially with each other and that (ii) two limiting plates (namely, second limiting plates 42, third limiting plates 72, or fourth limiting plates 82) that are disposed directly above respective first limiting plates 32 adjacent to each other and that face each other on a plane are separated from each other by a distance that is larger as the two limiting plates are closer to the vapor deposition mask 50.

For instance, the individual limiting plate stages are preferably configured as illustrated in FIG. 18 and (a) and (b) of FIG. 19 such that two limiting plates (for example, second limiting plates 42, third limiting plates 72, and fourth limiting plates 82) disposed directly above any first limiting plate 32 in a plan view are separated from each other by an opening having a width that is smaller as the two limiting plates are disposed further above (that is, separated to form an inverted V shape with the two inclined lines separated from each other by a gap at the center).

In a case where the individual limiting plate stages arranged in the Z axis direction are separated from each other by a gap, vapor deposition flows may leak through that gap.

The above configuration, however, prevents vapor deposition flows from leaking through a gap between limiting plates disposed directly above any first limiting plate 32 (for example, second limiting plates 42, third limiting plates 72, and fourth limiting plates 82). Further, with the above configuration, the space volume directly above any opening area between the first limiting plates 32 (that is, any limiting plate opening 33) is larger on the vapor deposition mask 50 side, which corresponds to the direction in which vapor deposition particles 401 fly. This makes it possible to prevent vapor deposition particles 401 from being scattered. The above configuration can therefore more effectively capture vapor deposition flows having spread after passing through the opening areas between the first limiting plates 32 (that is, the limiting plate openings 33).

Further, in the above case, the limiting plates (namely, the second limiting plates 42, the third limiting plates 72, and the fourth limiting plates 82) disposed directly above the first limiting plates 32 are preferably configured such that as illustrated in (a) of FIG. 19, the limiting plates of an upper stage each have, on the side of an X axis end of the corresponding first limiting plate 32, an end surface in contact (for example, flush) with at least a portion of an end surface of one of the limiting plates of a lower stage that are in contact with the upper limiting plates which end surface is on the side of the X axis center of the corresponding first limiting plate 32, more preferably configured such that as illustrated in (b) of FIG. 19, the limiting plates of respective stages adjacent to each other disposed directly above the first limiting plates 32, specifically, limiting plates in contact with each other (namely, the second limiting plates 42, the third limiting plates 72, and the fourth limiting plates 82) partially overlap each other.

The above configuration makes it possible to more reliably prevent vapor deposition flows from leaking through a gap between limiting plates of different stages adjacent to each other. The above configuration therefore makes it possible to more effectively capture vapor deposition flows having spread after passing through the opening areas between the first limiting plates 32 (that is, the limiting plate openings 33).

In the case where limiting plates in contact with each other are in contact at only edges thereof as illustrated in (a) of FIG. 19, it is necessary to align the individual limiting plates of the different stages precisely. In contrast, in the case where limiting plates in contact with each other partially overlap each other as illustrated in (b) of FIG. 19, the alignment can advantageously be carried out easily.

The present variation is, as an example of the individual limiting plate stages being configured such that two limiting plates (for example, second limiting plates 42, third limiting plates 72, and fourth limiting plates 82) disposed directly above any first limiting plate 32 in a plan view are separated from each other by an opening having a width that is smaller as the two limiting plates are disposed further above, an example case in which the second limiting plates 42, the third limiting plates 72, and the fourth limiting plates 82 are disposed directly above the first limiting plates 32. It is needless to say, however, that similar effects can be produced even in a case where only the second limiting plates 42 and the third limiting plates 72 are disposed directly above the first limiting plates 32.

In the case where as illustrated in FIG. 10, the second limiting plates 42 are so oriented that two second limiting plates 42 of any pair disposed directly above a first limiting plate 32 form an inverted V shape with the two inclined lines separated from each other by a gap at the center, it may be advantageously easier than in the present variation to position the limiting plates. The vapor deposition unit 1 illustrated in FIG. 10 is, however, configured such that the limiting plate unit 20 includes only second limiting plates 42 directly above the first limiting plates. This means that it is necessary, when the second limiting plates 42 are replaced with another set for prevention of contamination caused by vapor deposition particles 401 adhering to the second limiting plates 42, to replace the entire set of second limiting plates 42. In contrast, in the case where a vapor deposition unit 1 includes a plurality of limiting plate stages as in the present variation, it is possible to replace only limiting plates contaminated heavily by adherence of vapor deposition particles 401, so that the vapor deposition unit 1 is easy to maintain.

In a case where the second limiting plates 42 each have a lowermost portion (lower surface) in (close) contact with an uppermost portion (upper surface) of the corresponding first limiting plate 32 as illustrated in FIG. 18 and (a) and (b) of FIG. 19, although it is necessary to increase the number of limiting plate stages arranged in the Z axis direction in correspondence with an increase in the vapor deposition rate, there are, in any case, merely needed only a pair of limiting plates for each stage disposed directly above each first limiting plate in a plan view, and this is the most effective arrangement.

However, in a case where no close contact can be achieved due to some circumstances between the respective lowermost portions of the second limiting plates 42 and the respective uppermost portions of the corresponding first limiting plates, simply providing pairs of limiting plates for each stage disposed directly above the first limiting plates 32 in a plan view may, depending on the vapor deposition rate, not make it possible to capture vapor deposition flows spreading after passing through the limiting plate openings 33. In this case, it is desirable to provide, for example, sets of three or more limiting plates for each stage as in Embodiment 2.

The above desirable arrangement, however, increases the number of gaps between limiting plates. Therefore, the present variation also is preferably configured such that there is no gap between the limiting plates of each stage.

FIG. 20 is a cross-sectional view schematically illustrating an example configuration of a vapor deposition unit 1 in accordance with the present variation.

The vapor deposition unit 1 of the present variation also is configured as illustrated in FIG. 20 such that (i) limiting plates (namely, second limiting plates 42, third limiting plates 72, and fourth limiting plates 82) disposed directly above any first limiting plate 32 in a plan view are in contact at least partially with each other and that (ii) two limiting plates (namely, second limiting plates 42, third limiting plates 72, or fourth limiting plates 82) which are disposed directly above respective first limiting plates 32 adjacent to each other and which face each other on a plane are separated from each other by a distance which is larger as the two limiting plates are closer to the vapor deposition mask 50.

Thus, the present variation also makes it possible to prevent vapor deposition flows from leaking through a gap between limiting plates disposed directly above any first limiting plate 32 (for example, second limiting plates 42, third limiting plates 72, and fourth limiting plates 82). Further, with the present variation, the space volume directly above any opening area between the first limiting plates 32 (that is, any limiting plate opening 33) is larger on the vapor deposition mask 50 side, which corresponds to the direction in which vapor deposition particles 401 fly. This makes it possible to prevent vapor deposition particles 401 from being scattered. The present variation therefore makes it possible to more effectively capture vapor deposition flows having spread after passing through the opening areas between the first limiting plates 32 (that is, the limiting plate openings 33).

Variations 3 and 4 are each illustrated as an example case in which the fourth limiting plate assembly 80 includes fourth limiting plates 82. The fourth limiting plates 82 may, similarly to the third limiting plates 72, also be held by the holding body for holding at least either the second limiting plates 42 or the third limiting plates 72. For instance, the second limiting plate assembly 40 may include the second limiting plates 42, the third limiting plates 72, and the fourth limiting plates 82.

It is needless to say that the third limiting plates 72 may vary to employ an idea similar to any of the ideas discussed about the second limiting plates 42 of Embodiments 1 and 2. Further, it is needless to say that the fourth limiting plates 82 may also vary to employ an idea similar to any of the ideas discussed about the third limiting plates 72.

The present embodiment is described below with reference to FIG. 21.

The description below will deal mainly with how the present embodiment differs from Embodiments 1 and 2. Any member of the present embodiment that is identical in function to a corresponding member of Embodiment 1 is assigned a common reference numeral, and is not described here.

FIG. 21 is a cross-sectional view schematically illustrating a configuration of a substantial part of the vapor deposition unit 1 in accordance with the present embodiment together with a film formation target substrate 200.

The present embodiment is identical to Embodiment 1 except that as illustrated in FIG. 21, the present embodiment includes, instead of the second limiting plates 42 disposed directly above the first limiting plates 32, two protrusions 32a arranged on an upper surface of each first limiting plate 32 in the X axis direction along the first limiting plates 32 and extending in the Z axis direction.

As described for Embodiment 1, the first limiting plates 32 and the second limiting plates 42 are most preferably in (close) contact with each other as illustrated, for example, in FIG. 8.

Comparison of FIG. 21 with FIG. 8 will show that the configuration illustrated in FIG. 21 produces effects similar to those produced by the configuration illustrated in FIG. 8.

Specifically, the present embodiment is configured to, with use of the first limiting plates 32, restrict spread of flows of vapor deposition particles 401 emitted by the vapor deposition source 10 (vapor deposition flows). This configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again when passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by the protrusions 32*a* so that spread of the vapor deposition flows is restricted, and pass through the vapor deposition mask 50 while spread of the vapor deposition flows is restricted. At this stage, the two protrusions 32*a* arranged on the upper surface of each first limiting plate 32 in the first direction along the first limiting plate 32 can effectively capture vapor deposition flows spreading to the two first-direction sides of the first limiting plate 32. The above configuration can thus effectively restrict spread of vapor deposition flows in the first direction. The above configuration, as a result, makes it possible to (i) prevent film formation abnormalities such as an abnormally patterned film and (ii) form a high definition pattern of a vapor-deposited film.

The protrusions 32*a* disposed on the upper surface of each first limiting plate 32 can, unlike limiting plates disposed directly above each limiting plate opening 33, efficiently capture only a component with actually poor directivity without decreasing the vapor deposition rate at all.

In the case where the limiting plate unit 20 includes only the second limiting plates 42 directly above the first limiting plates 32, it is possible, when the second limiting plates 42 are replaced with another set for prevention of contamination caused by vapor deposition particles 401 adhering to the second limiting plates 42, to replace only limiting plates contaminated heavily by adherence of vapor deposition particles 401, so that the vapor deposition unit 1 is advantageously easy to maintain. In contrast, the present embodiment is advantageous in that it is possible to (i) eliminate the need to align the second limiting plates 42 for positioning of the second limiting plates 42 directly above the first limiting plates 32 and thus (ii) easily dispose limiting plates.

The protrusions 32*a* may be formed on the first limiting plates 32 by any publicly known method such as casting or injection molding.

In the case where the vapor deposition unit 1 includes, instead of the second limiting plates 42 disposed directly above the first limiting plates 32, protrusions 32*a* on the upper surface of each first limiting plate 32, the protrusions 32*a* (which correspond to the second limiting plates 42) are, as illustrated in FIG. 21, preferably in contact (for example, flush) with at least a portion of the two X axis ends of each first limiting plate 32 (that is, a portion of the two X axis ends of each first limiting plate 32 which portion is other than the protrusions 32*a*) similarly to the case where the vapor deposition unit 1 includes the second limiting plates 42 directly above the first limiting plates 32.

The above arrangement makes it possible to efficiently capture vapor deposition flows spreading to the two X axis ends of each first limiting plate 32. The above arrangement thus makes it possible to more effectively restrict spreading of vapor deposition flows to the two X axis ends of each first limiting plate 32.

It is needless to say that the protrusions 32*a* of the present embodiment may also vary to employ any of the ideas discussed about the second limiting plates 42 of Embodiments 1 and 2. The protrusions 32*a* may, for example, also vary in shape similarly to the second limiting plates 42 illustrated in (a) through (e) of FIG. 11. In other words, the descriptions of the second limiting plates 42 may similarly apply to the protrusions 32*a*.

FIG. 21 illustrates an example case in which two protrusions 32*a* are formed on the upper surface of each first limiting plate 32. There may, however, be three or more protrusions 32*a* for each first limiting plate 32.

For instance, in a case where there is provided, between two protrusions 32*a* provided at the respective X axis ends of each first limiting plate 32, a protrusion 32*a* protruding in the Z axis direction compared to the two protrusions 32*a* at the respective X axis ends (in this case, a protrusion 32*a* larger in length in the Z axis direction than the two protrusions 32*a* at the respective X axis ends), it is possible, also in the case where the protrusions 32*a* are formed on the upper surface of each first limiting plate 32, to capture vapor deposition flows, which were not captured by two protrusions 32*a* provided at the respective X axis ends, with use of the protrusion 32*a* provided between the two protrusions 32*a* at the respective X axis ends as in Embodiment 2.

In this case also, there is no particular limit to the number of protrusions 32*a* provided between the two protrusions 32*a* at the respective X axis ends. For example, there may be provided, between the two protrusions 32*a* at the respective X-axis ends, (i) only one protrusion 32*a* at the X axis center of each first limiting plate 32 or (ii) two or more protrusions 32*a* provided away from each other.

In this case, the protrusion 32*a* provided between the two protrusions 32*a* at the respective X axis ends has any height that is, for example, set as appropriate depending on the vapor deposition material used, the vapor deposition rate, and/or the like so that the capturing efficiency will be increased and that a decrease in the volume of a space in which vapor deposition particles 401 are scattered will not cause the pressure in the space to rise excessively.

The above variations are mere examples. The present invention is not limited to the above variations.

In a first aspect of the present invention, a vapor deposition unit 1 includes: a vapor deposition mask 50; a vapor deposition source 10 for emitting vapor deposition particles 401 toward the vapor deposition mask 50; and a limiting plate unit 20 provided between the vapor deposition mask 50 and the vapor deposition source 10 so as to limit an angle at which the vapor deposition particles 401 emitted by the vapor deposition source 10 pass through the limiting plate unit 20, the limiting plate unit 20 including a plurality of stages of limiting plates (for example, first limiting plates 32, second limiting plates 42, third limiting plates 72, and fourth limiting plates 82) including at least: a plurality of first limiting plates 32 provided away from each other in a first direction (X axis direction); and a plurality of second limiting plates 42 provided (i) directly above the plurality of first limiting plates 32 in a plan view, (ii) away from each other in the first direction, and (iii) along the plurality of first limiting plates, the plurality of second limiting plates 42 being provided such that at least two second limiting plates 42 are arranged in the first direction so as to correspond to each of the plurality of first limiting plates (first limiting plates 32).

The above configuration makes it possible to, with use of the first limiting plates 32, restrict spread of flows of vapor deposition particles 401 emitted by the vapor deposition source 10 (vapor deposition flows). The above configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again after passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by subsequent stages of limiting plates including at least the second limiting plates 42 (for example, the second limiting plates 42, the third limiting plates 72, and the fourth limiting plates 82) so that spread of the vapor deposition flows is restricted, and pass through the vapor deposition mask 50 while spread of the vapor deposition flows is restricted. The at least two second limiting plates 42 arranged in the first direction so as to correspond to each first limiting plate (first limiting plate 32) can effectively capture vapor deposition flows spreading to the two first-direction sides of the first limiting plate 32. The above configuration can thus effectively restrict spread of vapor deposition flows in the first direction. The above configuration, as a result, makes it possible to (i) prevent film formation abnormalities such as an abnormally patterned film and (ii) form a fine pattern of a vapor-deposited film. Further, with the above configuration, the second limiting plates 42 are disposed directly above the first limiting plates 32 in a plan view, and are absent directly above the opening areas between the first limiting plates (that is, the limiting plate openings 33). The above configuration thus makes it possible to efficiently capture only a component with actually poor directivity without decreasing the vapor deposition rate at all.

In a second aspect of the present invention, a vapor deposition unit 1 is preferably arranged such that, in the first aspect of the present invention, the plurality of second limiting plates 42 each have a length in a second direction (Y axis direction), perpendicular to the first direction, which length is smaller than a length of each of the plurality of first limiting plates 32 in the second direction; and the plurality of second limiting plates 42 are provided (i) directly above the plurality of first limiting plates 32 in the plan view and (ii) discontinuously in the second direction.

With the above configuration, the second limiting plates 42 are disposed directly above the first limiting plates 32 and arranged discontinuously in the second direction, which is perpendicular to the first direction. The above configuration thus allows a finer adjustment of the arrangement of the second limiting plates 42 and facilitates replacement of the second limiting plates 42.

In a third aspect of the present invention, a vapor deposition unit 1 is preferably arranged such that, in the first aspect of the present invention, as viewed in a direction perpendicular to a principal surface of the vapor deposition mask 50, the vapor deposition source 10 has emission holes 11 for the vapor deposition particles 401 each of which emission holes 11 is between any two mutually adjacent first limiting plates 32 included in the plurality of first limiting plates 32; the plurality of second limiting plates 42 each have a length in a second direction, perpendicular to the first direction, which length is smaller than a length of each of the plurality of first limiting plates 32 in the second direction; and as viewed in the direction perpendicular to the principal surface of the vapor deposition mask 50, the plurality of second limiting plates 42 are adjacent to the emission holes 11.

At any position directly above (i) an emission hole 11 and (ii) its vicinity, the vapor deposition density is high, and a large number of vapor deposition particles 401 collide with each other and are scattered due to the high vapor deposition density. The second limiting plates 42 are thus desirably disposed at those positions. At any position far from an emission hole 11, on the other hand, the vapor deposition density is low, and a small number of vapor deposition particles 401 collide with each other and are scattered. The second limiting plates 42 are thus not necessarily disposed at those positions.

The above configuration allows second limiting plates 42 to be provided only at necessary positions, and is therefore inexpensive.

In a fourth aspect of the present invention, a vapor deposition unit 1 is preferably arranged such that, in the third aspect of the present invention, as viewed in the direction perpendicular to the principal surface of the vapor deposition mask 50, the plurality of second limiting plates 42 each have a tapering end in the second direction.

The second limiting plates 42 preferably occupy only a small volume so that a sharp pressure change will not change the distribution of vapor deposition flows having passed through the opening areas between the first limiting plates 32 (that is, the limiting plate openings 33). The above configuration makes it possible to reduce the change in the distribution of vapor deposition flows having passed through the opening areas between the first limiting plates 32, and thus allows control to be carried out with higher accuracy.

In a fifth aspect of the present invention, a vapor deposition unit 1 is preferably arranged such that, in any one of the first to fourth aspects of the present invention, the plurality of second limiting plates 42 are each positioned so as to be in contact with at least a portion of one of both ends of a corresponding one of the plurality of first limiting plates 32 which ends are opposite to each other in the first direction. For example, the vapor deposition unit 1 is preferably arranged such that the plurality of second limiting plates 42 are in contact with the plurality of first limiting plates 32 and are positioned at least so as to be flush with respective ends of a corresponding one of the plurality of first limiting plates 32 which respective ends are opposite to each other in the first direction.

The vapor deposition density is high at and near an upper portion of each opening area between the first limiting plates 32 (that is, each limiting plate opening 33). This high vapor deposition density causes more vapor deposition particles 401 to be scattered, and thus likely causes vapor deposition flows to spread. The above configuration makes it possible to efficiently capture vapor deposition flows spreading to the two first-direction ends of each first limiting plate 32. The above configuration thus makes it possible to more effectively restrict spreading of vapor deposition flows to the two first-direction ends.

In a sixth aspect of the present invention, a vapor deposition unit 1 is preferably arranged such that, in any one of the first to fifth aspects of the present invention, the plurality of second limiting plates 42 are provided such that three second limiting plates 42 are arranged in the first direction so as to correspond to each of the plurality of first limiting plates (first limiting plates 32).

In the case where three second limiting plates 42 are arranged in the first direction for each first limiting plate (first limiting plate 32), it is possible to, without decreasing the dimensional accuracy or causing a sharp pressure change, capture, depending on the respective positions of the second limiting plates 42, (i) vapor deposition flows that are about to spread after passing through the opening areas between the first limiting plates 32 (that is, the limiting plate openings 33) or (ii) vapor deposition flows that have spread extremely greatly after passing through the opening areas between the first limiting plates 32 (that is, the limiting plate openings 33).

In a seventh aspect of the present invention, a vapor deposition unit 1 is preferably arranged to, in any one of the first to sixth aspects of the present invention, further include at least a plurality of third limiting plates 72 provided (i) directly above the plurality of first limiting plates 32 in the plan view, (ii) above the plurality of second limiting plates 42 in the plan view, (iii) away from each other in the first direction, and (iv) along the plurality of first limiting plates 32.

The above configuration allows at least the third limiting plates 72 to be disposed directly above the second limiting plates 42. The above configuration thus makes it possible to not only (i) prevent an increase in the number of second limiting plates 42 arranged in the first direction (X axis direction) for each first limiting plate 32, but also (ii) capture vapor deposition flows having spread after passing through the opening areas between the first limiting plates 32 (that is, the limiting plate openings 33). Further, the above configuration makes it possible to dispose limiting plates (namely, the second limiting plates 42 and the third limiting plates 72) directly above the first limiting plates 32 accurately for any spread of vapor deposition flows. The above configuration thus makes it possible to prevent a pressure change after the passage through the opening areas between the first limiting plates 32 and effectively prevent film formation abnormalities.

In an eighth aspect of the present invention, a vapor deposition unit 1 is preferably arranged to, in the first aspect of the present invention, further include a plurality of third limiting plates 72 provided (i) directly above the plurality of first limiting plates 32 in the plan view, (ii) above the plurality of second limiting plates 42 in the plan view, (iii) away from each other in the first direction, and (iv) along the plurality of first limiting plates 32, wherein two or more of the plurality of stages of limiting plates (namely, the second limiting plates 42, the third limiting plates 72, and the fourth limiting plates 82), which two or more stages of limiting plates are provided directly above the plurality of first limiting plates 32 in the plan view and include the plurality of second limiting plates 42 and the plurality of third limiting plates 72, are at least partially in contact with each other and are disposed such that respective limiting plates (namely, the second limiting plates 42, the third limiting plates 72, and the fourth limiting plates 82) directly above first limiting plates 32 adjacent to each other which respective limiting plates face each other on a plane are separated from each other by a distance that is larger as the respective limiting plates are closer to the vapor deposition mask 50.

The above configuration makes it possible to prevent vapor deposition flows from leaking through a gap between limiting plates disposed directly above any first limiting plate 32 (for example, second limiting plates 42, third limiting plates 72, and fourth limiting plates 82). Further, with the above configuration, the space volume directly above any opening area between the first limiting plates 32 (that is, any limiting plate opening 33) is larger at a position closer to the vapor deposition mask 50, which corresponds to the direction in which vapor deposition particles 401 fly. This makes it possible to prevent vapor deposition particles 401 from being scattered. The above configuration therefore makes it possible to more effectively capture vapor deposition flows having spread after passing through the opening areas between the first limiting plates 32 (that is, the limiting plate openings 33).

In a ninth aspect of the present invention, a vapor deposition unit 1 is preferably arranged such that, in the eighth aspect of the present invention, two or more of the plurality of stages of limiting plates (namely, the second limiting plates 42, the third limiting plates 72, and the fourth limiting plates 82), which two or more stages of limiting plates are provided directly above the plurality of first limiting plates 32 in the plan view and include the plurality of second limiting plates 42 and the plurality of third limiting plates 72, are disposed such that limiting plates of a stage partially overlap limiting plates of a stage adjacent to the stage.

The above configuration makes it possible to more reliably prevent vapor deposition flows from leaking through a gap between limiting plates of different stages adjacent to each other. Further, with the above configuration, the space volume directly above any opening area between the first limiting plates 32 (that is, any limiting plate opening 33) is larger at a position closer to the vapor deposition mask 50, which corresponds to the direction in which vapor deposition particles 401 fly. This makes it possible to prevent vapor deposition particles 401 from being scattered. The above configuration therefore makes it possible to more effectively capture vapor deposition flows having spread after passing through the opening areas between the first limiting plates 32 (that is, the limiting plate openings 33).

In a tenth aspect of the present invention, a vapor deposition unit 1 is preferably arranged such that, in the first aspect of the present invention, the plurality of second limiting plates 42 are provided such that two second limiting plates 42 are arranged in the first direction so as to correspond to each of the plurality of first limiting plates 32; and the two second limiting plates 42 are inclined such that the two second limiting plates 42 are separated from each other by a width that is smaller at a position further above.

With the above configuration, the space volume directly above any opening area between the first limiting plates 32 (that is, any limiting plate opening 33) is larger at a position closer to the vapor deposition mask 50, which corresponds to the direction in which vapor deposition particles 401 fly (in other words, second limiting plates 42 directly above respective first limiting plates adjacent to each other which second limiting plates 42 face each other on a plane are separated from each other by a distance (that is, the length of each limiting plate opening 43b in the first direction) that is larger at a position closer to the vapor deposition mask 50). The above configuration thus makes it possible to prevent vapor deposition particles 401 from being scattered and more effectively capture vapor deposition flows having spread after passing through the opening areas between the first limiting plates 32 (that is, the limiting plate openings 33).

In an eleventh aspect of the present invention, a vapor deposition unit 1 includes: a vapor deposition mask 50; a vapor deposition source 10 for emitting vapor deposition particles 401 toward the vapor deposition mask 50; and a limiting plate unit 20 provided between the vapor deposition mask 50 and the vapor deposition source 10 so as to limit an angle at which the vapor deposition particles 401 emitted by the vapor deposition source 10 pass through the limiting plate unit 20, the limiting plate unit 20 including a plurality of first limiting plates 32 provided away from each other in a first direction (X axis direction), the plurality of first limiting plates 32 each having an upper surface on which at least two protrusions 32a are arranged in the first direction along the plurality of first limiting plates 32.

The above configuration makes it possible to, with use of the first limiting plates 32, restrict spread of flows of vapor deposition particles 401 emitted by the vapor deposition source 10 (vapor deposition flows). The above configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again when passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by the protrusions 32a so that spread of the vapor deposition flows is restricted, and pass through the vapor deposition mask 50 while spread of the vapor deposition flows is restricted. At least two protrusions 32a arranged on the upper surface of each first limiting plate 32 in the first direction along the first limiting plate 32 can effectively capture vapor deposition flows spreading to the two first-direction sides of the first limiting plate 32. The above configuration can thus effectively restrict spread of vapor deposition flows in the first direction. The above configuration, as a result, makes it possible to (i) prevent film formation abnormalities such as an abnormally patterned film and (ii) form a high definition pattern of a vapor-deposited film. Further, with the above configuration, the protrusions 32a disposed on the upper surface of each first limiting plate 32 can, unlike limiting plates disposed directly above each opening area between the first limiting plates 32 (that is, each limiting plate opening 33), efficiently capture only a component with actually poor directivity without decreasing the vapor deposition rate at all.

In a twelfth aspect of the present invention, a vapor deposition unit 1 is preferably arranged such that, in the eleventh aspect of the present invention, as viewed in a direction perpendicular to a principal surface of the vapor deposition mask 50, the vapor deposition source 10 has emission holes 11 for the vapor deposition particles 401 each of which emission holes 11 is between any two mutually adjacent first limiting plates 32 included in the plurality of first limiting plates 32; the at least two protrusions 32a each have a length in a second direction (Y axis direction), perpendicular to the first direction, which length is smaller than a length of each of the plurality of first limiting plates 32 in the second direction; and as viewed in the direction perpendicular to the principal surface of the vapor deposition mask 50, the at least two protrusions 32a are adjacent to the emission holes 11.

At any position directly above (i) an emission hole 11 and (ii) its vicinity, the vapor deposition density is high, and a large number of vapor deposition particles 401 collide with each other and are scattered due to the high vapor deposition density. At any position far from an emission hole 11, on the other hand, the vapor deposition density is low, and a small number of vapor deposition particles 401 collide with each other and are scattered.

The protrusions 32a are thus preferably adjacent to the emission holes 11. This configuration allows protrusions 32a to be provided only at necessary positions, and is therefore inexpensive.

In a thirteenth aspect of the present invention, a vapor deposition unit 1 is arranged such that, in the eleventh or twelfth aspect of the present invention, the at least two protrusions 32a are positioned at least so as to be flush with respective ends of a corresponding one of the plurality of first limiting plates 32 which respective ends are opposite to each other in the first direction.

The vapor deposition density is high at and near an upper portion of each opening area between the first limiting plates 32 (that is, each limiting plate opening 33). This high vapor deposition density causes more vapor deposition particles 401 to be scattered, and thus more likely causes vapor deposition flows to spread. The above configuration makes it possible to efficiently capture vapor deposition flows spreading to the two first-direction ends of each first limiting plate 32. The above configuration thus makes it possible to more effectively restrict spreading of vapor deposition flows to the two first-direction ends.

In a fourteenth aspect of the present invention, a vapor deposition device 100 includes: a vapor deposition unit 1 according to any one of the first to thirteenth aspects; and a moving device (at least one of the substrate moving device 103 and the vapor deposition unit moving device 104) for, in a state where the vapor deposition mask 50 of the vapor deposition unit 1 faces a film formation target substrate 200, moving a first one of the vapor deposition unit 1 and the film formation target substrate 200 relative to a second one thereof in a second direction, perpendicular to the first direction, the vapor deposition mask 50 having a width in the second direction which width is smaller than a width of the film formation target substrate 200 in the second direction, the vapor deposition device, while scanning the film formation target substrate 200 in the second direction, causing the vapor deposition particles 401 emitted by the vapor deposition source to be vapor-deposited onto the film formation target substrate 200 through an opening of the limiting plate unit 20 and an opening of the vapor deposition mask 50 (limiting plate openings 33, 34b, 82b, 92b).

The above configuration makes it possible to, with use of the first limiting plates 32, restrict spread of flows of vapor deposition particles 401 emitted by the vapor deposition source 10 (vapor deposition flows). The above configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again after passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by (i) subsequent stages of limiting plates including at least the second limiting plates 42 (the second limiting plates 42, the third limiting plates 72, and the fourth limiting plates 82) or (ii) the protrusions 32a so that spread of the vapor deposition flows is restricted, and pass through the vapor deposition mask 50 while spread of the vapor deposition flows is restricted. The at least two second limiting plates 42 arranged in the first direction so as to correspond to each first limiting plate can effectively capture vapor deposition flows spreading to the two first-direction sides of the first limiting plate 32. The above configuration can thus effectively restrict spread of vapor deposition flows in the first direction.

Therefore, the above configuration makes it possible to (i) prevent film formation abnormalities such as an abnormally patterned film and (ii) form a fine pattern of a vapor-deposited film in a case where scan vapor deposition based on a scanning method is carried out which allows vapor deposition to be carried out while the film formation target substrate 200 and the vapor deposition unit 1 are moved relative to each other for scanning.

In a fifteenth aspect of the present invention, a limiting plate unit 20 is a limiting plate unit 20 provided between a vapor deposition mask 50 and a vapor deposition source 10 so as to limit an angle at which vapor deposition particles 401 emitted by the vapor deposition source 10 pass through the limiting plate unit, the limiting plate unit including a plurality of stages of limiting plates (first limiting plates 32, second limiting plates 42, third limiting plates 72, and fourth limiting plates 82) including at least: a plurality of first limiting plates 32 provided away from each other in a first direction (X axis direction); and a plurality of second limiting plates provided (i) directly above the plurality of first limiting plates 32 in a plan view, (ii) away from each other in the first direction, and (iii) along the plurality of first limiting plates 32, the plurality of second limiting plates 42 being provided such that at least two second limiting plates 42 are arranged in the first direction so as to correspond to each of the plurality of first limiting plates 32.

The above configuration makes it possible to, with use of the first limiting plates 32, restrict spread of flows of vapor deposition particles 401 emitted by the vapor deposition source 10 (vapor deposition flows). The above configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again after passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by subsequent stages of limiting plates including at least the second limiting plates 42 (the second limiting plates 42, the third limiting plates 72, and the fourth limiting plates 82) so that spread of the vapor deposition flows is restricted, and pass through the vapor deposition mask 50 while spread of the vapor deposition flows is restricted. The at least two second limiting plates 42 arranged in the first direction so as to correspond to each first limiting plate can effectively capture vapor deposition flows spreading to the two first-direction sides of the first limiting plate 32. The above configuration can thus effectively restrict spread of vapor deposition flows in the first direction. The above configuration, as a result, makes it possible to (i) prevent film formation abnormalities such as an abnormally patterned film and (ii) form a fine pattern of a vapor-deposited film. Further, with the above configuration, the second limiting plates 42 are disposed directly above the first limiting plates 32 in a plan view, and are absent directly above the opening areas between the first limiting plates (that is, the limiting plate openings 33). The above configuration thus makes it possible to efficiently capture only a component with actually poor directivity without decreasing the vapor deposition rate at all.

In a sixteenth aspect of the present invention, a limiting plate unit 20 is a limiting plate unit 20 limiting plate unit provided between a vapor deposition mask 50 and a vapor deposition source 10 so as to limit an angle at which vapor deposition particles 401 emitted by the vapor deposition source 10 pass through the limiting plate unit, the limiting plate unit including a plurality of first limiting plates 32 provided away from each other in a first direction, the plurality of first limiting plates 32 each having an upper surface on which at least two protrusions 32a are arranged in the first direction along the plurality of first limiting plates 32.

The above configuration makes it possible to, with use of the first limiting plates 32, restrict spread of flows of vapor deposition particles 401 emitted by the vapor deposition source 10 (vapor deposition flows). The above configuration allows vapor deposition particles 401 having poor directivity to be blocked (captured) and controlled for a distribution with high directivity. The controlled vapor deposition flows, in a case where the vapor deposition density is high (that is, at a high vapor deposition rate), tend to spread again when passing through the opening areas between the first limiting plates 32 (that is, the limiting plate openings 33) due to collision between and/or scattering of the vapor deposition particles 401 which collision and scattering result from the high vapor deposition density. The vapor deposition flows are, however, captured by the protrusions 32a so that spread of the vapor deposition flows is restricted, and pass through the vapor deposition mask 50 while spread of the vapor deposition flows is restricted. At least two protrusions 32a arranged on the upper surface of each first limiting plate 32 in the first direction along the first limiting plate 32 can effectively capture vapor deposition flows spreading to the two first-direction sides of the first limiting plate 32. The above configuration can thus effectively restrict spread of vapor deposition flows in the first direction. The above configuration, as a result, makes it possible to (i) prevent film formation abnormalities such as an abnormally patterned film and (ii) form a high definition pattern of a vapor-deposited film. Further, with the above configuration, the protrusions 32a disposed on the upper surface of each first limiting plate 32 can, unlike limiting plates disposed directly above each opening area between the first limiting plates 32 (that is, each limiting plate opening 33), efficiently capture only a component with actually poor directivity without decreasing the vapor deposition rate at all.

For the embodiments and aspects described above, the expression "adjacent film formation region" refers not only to a film formation region immediately adjacent to a film formation region (targeted film formation region) as a target of film formation by a certain nozzle 301a (particular nozzle 301a) (that is, an adjacent film formation region of the film formation target substrate 200 which adjacent film formation region corresponds to a nozzle 301a adjacent to the certain nozzle 301a), but also to any other film formation region other than the targeted film formation region. For instance, in a case where vapor deposition particles 401 are scattered extremely strongly, vapor deposition particles 401 emitted from a particular nozzle 301a may enter a film formation region farther away from an adjacent film formation region (for example, a film formation region adjacent to a film formation region that is adjacent to a targeted film formation region). Even in the case where vapor deposition particles 401 are scattered extremely strongly as such, the present invention is effective.

The present invention is not limited to the description of the embodiments above, but may be altered in various ways by a skilled person within the scope of the claims. Any embodiment based on a proper combination of technical means disclosed in different embodiments is also encompassed in the technical scope of the present invention. Further, combining different technical means disclosed in different embodiments can provide a new technical feature.

The present invention is suitably applicable to (i) a vapor deposition unit and a limiting plate unit each for use in scan vapor deposition based on a scanning method which scan vapor deposition allows vapor deposition to be carried out while a film formation target substrate and a vapor deposition unit are moved relative to each other for scanning, and to (ii) a vapor deposition device including the vapor deposition unit to form a film having a predetermined pattern. The vapor deposition unit, vapor deposition device, and limiting plate unit of the present invention are, in particular, suitably applicable to, for example, a device and method for producing an organic EL display device which device and method are each used in a film forming process of, for example, selectively forming organic layers for an organic EL display device or the like.

REFERENCE SIGNS LIST 1 vapor deposition unit
10 vapor deposition source
11 emission hole
20 limiting plate unit
30 first limiting plate assembly
31 first limiting plate row
32 second limiting plate
32a protrusion
33 limiting plate opening
37 supporting section
38 cooling mechanism
40 second limiting plate assembly
41 second limiting plate row
42 second limiting plate
43a, 43b limiting plate opening
44 first holding member
45 second holding member
46 holding body
47 supporting section
48 cooling mechanism
50 vapor deposition mask
51 mask opening
52 alignment marker
60 holder
61 sliding device
62 supporting member
63 tension mechanism
65 deposition preventing plate
70 third limiting plate assembly
71 third limiting plate row
72 third limiting plate
73, 73a, 73b limiting plate opening
80 fourth limiting plate assembly
81 fourth limiting plate row
82 fourth limiting plate
83a, 83b limiting plate opening
100 vapor deposition device
101 vacuum chamber
102 substrate holder
103 substrate moving device
104 vapor deposition unit moving device
105 image sensor
200 film formation target substrate
201 vapor deposition target surface
202 alignment marker
401 vapor deposition particle
402 vapor-deposited film
A dotted-line-enclosed region
B dotted-line-enclosed region

The invention claimed is:

1. A method for producing a vapor deposition film, comprising the steps of:

(a) providing a limiting plate unit between a vapor deposition mask and a vapor deposition source, the limiting plate unit including a plurality of stages of limiting plates including at least: a plurality of first limiting plates provided away from each other in a first direction; and a plurality of second limiting plates provided (i) directly above the plurality of first limiting plates in a plan view, (ii) away from each other in the first direction, and (iii) along the plurality of first limiting plates, the plurality of second limiting plates being provided such that at least two second limiting plates are arranged in the first direction so as to correspond to each of the plurality of first limiting plates;

(b) causing vapor deposition particles emitted by the vapor deposition source to be vapor-deposited onto a film formation target substrate through an opening of the limiting plate unit and an opening of the vapor deposition mask;

wherein the limiting plate unit further includes a plurality of third limiting plates provided (i) directly above the plurality of first limiting plates in the plan view, (ii) above the plurality of second limiting plates in the plan view, (iii) away from each other in the first direction, and (iv) along the plurality of first limiting plates, and wherein two or more of the plurality of stages of limiting plates, which two or more stages of limiting plates are provided directly above the plurality of first limiting plates in the plan view and include the plurality of second limiting plates and the plurality of third limiting plates, are at least partially in contact with each other and are disposed such that respective limiting plates directly above first limiting plates adjacent to each other which respective limiting plates face each other on a plane are separated from each other by a distance that is larger as the respective limiting plates are closer to the vapor deposition mask.

2. The method according to claim 1, wherein:

the vapor deposition mask having a width in a second direction, perpendicular to the first direction, which width is smaller than a width of the film formation target substrate in the second direction, in the step (a), in a state where the vapor deposition mask faces the film formation target substrate, a first one of (i) the vapor deposition unit including the vapor deposition mask, the vapor deposition source, and the limiting plate unit and (ii) the film formation target substrate are moved relative to a second one thereof in the second direction, so that the vapor deposition particles emitted by the vapor deposition source are caused to be vapor-deposited onto the film formation target substrate through an opening of the limiting plate unit and an opening of the vapor deposition mask while the film formation target substrate is scanned in the second direction.

3. The method according to claim 1, wherein:

the plurality of second limiting plates each have a length in a second direction, perpendicular to the first direction, which length is smaller than a length of each of the plurality of first limiting plates in the second direction; and the plurality of second limiting plates are provided (i) directly above the plurality of first limiting plates in the plan view and (ii) discontinuously in the second direction.

4. The method according to claim 1, wherein:

in the step (a), the vapor deposition source is positioned so that as viewed in a direction perpendicular to a principal surface of the vapor deposition mask, the vapor deposition source has emission holes for the vapor deposition particles each of which emission holes is between any two mutually adjacent first limiting plates included in the plurality of first limiting plates;

the plurality of second limiting plates each have a length in a second direction, perpendicular to the first direction, which length is smaller than a length of each of the plurality of first limiting plates in the second direction; and as viewed in the direction perpendicular to the principal surface of the vapor deposition mask, the plurality of second limiting plates are adjacent to the emission holes.

5. The method according to claim 4, wherein as viewed in the direction perpendicular to the principal surface of the vapor deposition mask, the plurality of second limiting plates each have a tapering end in the second direction.

6. The method according to claim 1, wherein the plurality of second limiting plates are each positioned so as to be in contact with at least a portion of one of both ends of a corresponding one of the plurality of first limiting plates which ends are opposite to each other in the first direction.

7. The method according to claim 1, wherein the plurality of second limiting plates are provided such that three second limiting plates are arranged in the first direction so as to correspond to each of the plurality of first limiting plates.

8. The method according to claim 1, wherein two or more of the plurality of stages of limiting plates, which two or more stages of limiting plates are provided directly above the plurality of first limiting plates in the plan view and include the plurality of second limiting plates and the plurality of third limiting plates, are disposed such that limiting plates of a stage partially overlap limiting plates of a stage adjacent to the stage.

9. The method according to claim 1, wherein:
the plurality of second limiting plates are provided such that two second limiting plates are arranged in the first direction so as to correspond to each of the plurality of first limiting plates; and
the two second limiting plates are inclined such that the two second limiting plates are separated from each other by a width that is smaller at a position further above.

10. A method for producing an organic EL display device, said method including the method according to claim 1.

11. The method according to claim 10, wherein a luminescent layer of the organic EL display device is made by the method according to claim 1.

* * * * *

UNITED STATES PATENT AND TRADEMARK OFFICE
CERTIFICATE OF CORRECTION

PATENT NO. : 10,184,167 B2
APPLICATION NO. : 14/897182
DATED : January 22, 2019
INVENTOR(S) : Yuhki Kobayashi et al.

It is certified that error appears in the above-identified patent and that said Letters Patent is hereby corrected as shown below:

On the Title Page

Item [22], PCT Filed delete:
"March 30, 2014"

And insert:
--March 10, 2014--

Signed and Sealed this
Fourth Day of June, 2019

Andrei Iancu
*Director of the United States Patent and Trademark Office*